(12) United States Patent
Azam et al.

(10) Patent No.: US 10,790,837 B1
(45) Date of Patent: Sep. 29, 2020

(54) SELF-TUNING DIGITAL CLOCK GENERATOR

(71) Applicant: QUALCOMM Incorporated, San Diego, CA (US)

(72) Inventors: Touqeer Azam, Cambridge (GB); John Bruce, Bishops Stortford (GB); David Weir, Balsham (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/660,432

(22) Filed: Oct. 22, 2019

(51) Int. Cl.
*H03D 3/24* (2006.01)
*H03L 7/099* (2006.01)
*H03K 3/03* (2006.01)
*H03L 7/091* (2006.01)
*G01R 31/30* (2006.01)
*H03L 7/183* (2006.01)
*H03L 7/081* (2006.01)
*G01R 31/317* (2006.01)
*H03K 3/011* (2006.01)

(52) U.S. Cl.
CPC ........ *H03L 7/0997* (2013.01); *G01R 31/3016* (2013.01); *G01R 31/31727* (2013.01); *H03K 3/011* (2013.01); *H03K 3/0315* (2013.01); *H03L 7/0814* (2013.01); *H03L 7/091* (2013.01); *H03L 7/183* (2013.01)

(58) Field of Classification Search
CPC ....... H03L 7/0997; H03L 7/091; H03L 7/183; H03L 7/0814; H03L 7/07; H03K 3/0315; H03K 3/011; G01R 31/3016; G01R 31/31727; H03F 1/3241
USPC .......................................... 375/373, 375, 376
See application file for complete search history.

(56) References Cited

U.S. PATENT DOCUMENTS

| | | | |
|---|---|---|---|
| 6,359,519 B1 | 3/2002 | Farrow | |
| 6,710,668 B1 | 3/2004 | Carpenter et al. | |
| 7,385,541 B2* | 6/2008 | Itahara | H03F 1/3241 341/144 |
| 7,679,458 B2 | 3/2010 | Malik | |
| 8,209,367 B2 | 6/2012 | Radja et al. | |
| 8,279,015 B2 | 10/2012 | Leistad et al. | |
| 2006/0001464 A1* | 1/2006 | Yokozeki | H03L 7/07 327/156 |

* cited by examiner

*Primary Examiner* — Phuong Phu
(74) *Attorney, Agent, or Firm* — Loza & Loza, LLP/Qualcomm

(57) ABSTRACT

In certain aspects, a clock generator includes a ring oscillator including an input and an output. The clock generator also includes a count circuit including an input and an output, wherein the input of the count circuit is coupled to the output of the ring oscillator. The clock generator also includes a comparator including a first input, a second input, and an output, wherein the first input of the comparator is configured to receive a first count value, and the second input of the comparator is coupled to the output of the count circuit. The clock generator further includes a shift register including a shift control input and an output, wherein the shift control input is coupled to the output of the comparator, and the output of the shift register is coupled to the input of the ring oscillator.

19 Claims, 17 Drawing Sheets

SELF-TUNING DIGITAL CLOCK GENERATOR

BACKGROUND

Field

Aspects of the present disclosure relate generally to clock generation, and more particularly, to clock generators.

Background

A chip may include a clock generator for generating a clock signal. The clock signal may be used to time operations of a circuit (e.g., a digital circuit) on the chip. For example, the clock signal may be used to synchronize the operations of devices (e.g., latches, sequential logic, etc.) in the circuit.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a clock generator. The clock generator includes a ring oscillator including an input and an output. The clock generator also includes a count circuit including an input and an output, wherein the input of the count circuit is coupled to the output of the ring oscillator. The clock generator also includes a comparator including a first input, a second input, and an output, wherein the first input of the comparator is configured to receive a first count value, and the second input of the comparator is coupled to the output of the count circuit. The clock generator further includes a shift register including a shift control input and an output, wherein the shift control input is coupled to the output of the comparator, and the output of the shift register is coupled to the input of the ring oscillator.

A second aspect relates to a method for controlling a ring oscillator. The method includes receiving a clock signal from the ring oscillator, counting periods of the clock signal over a count time window to generate a count value, comparing the generated count value with a target count value, and shifting control values in a shift register based on the comparison. The method also includes outputting the control values in the shift register to the ring oscillator, wherein the ring oscillator generates the clock signal based on the control values.

A third aspect relates to an apparatus for controlling a ring oscillator. The apparatus includes means for receiving a clock signal from the ring oscillator, means for counting periods of the clock signal over a count time window to generate a count value, means for comparing the generated count value with a target count value, and means for shifting control values in a shift register based on the comparison. The apparatus also includes means for outputting the control values in the shift register to the ring oscillator, wherein the ring oscillator generates the clock signal based on the control values.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, wellknown structures and components are shown in block diagram form in order to avoid obscuring such concepts.

Figure 1:
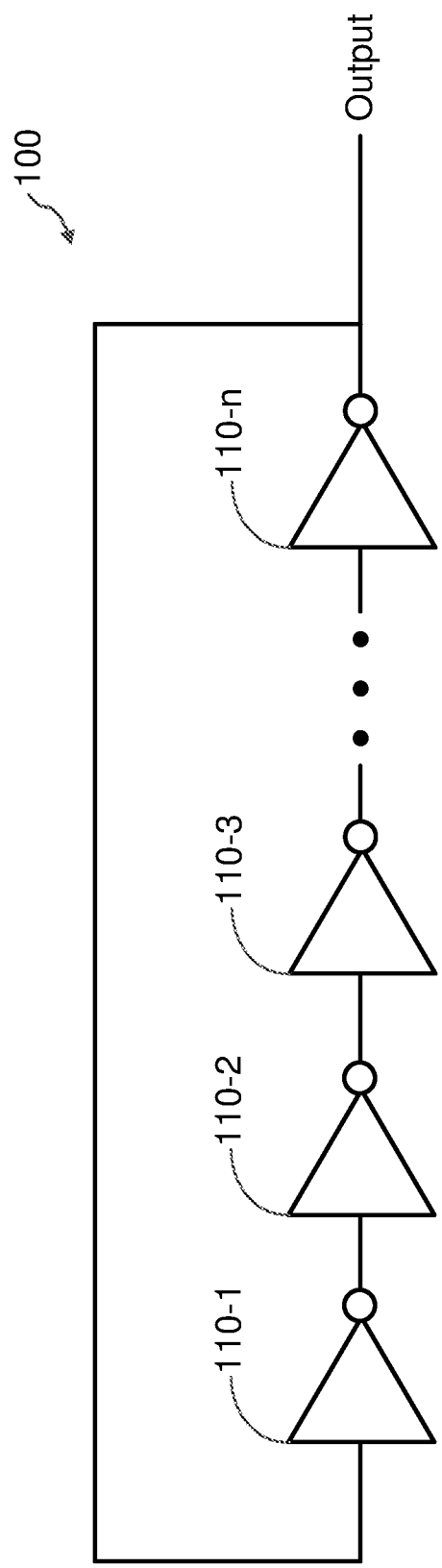
FIG. 1 shows an example of an inverter-based ring oscillator according to certain aspects of the present disclosure.

A chip may include a clock generator for generating a clock signal. The clock signal may be used to time operations of a circuit (e.g., a digital circuit) on the chip. One type of clock generator is an inverter-based ring oscillator 100 implemented with a chain of inverters 110-1 to 110-$n$, an example of which is shown in FIG. 1. In this example, the inverters 110-1 to 110-$n$ are coupled into a loop that oscillates to generate a digital clock signal. A drawback with the inverter-based ring oscillator 100 is that the delay of the loop (and hence the clock frequency of the inverter-based ring oscillator 100) varies with changing process-voltage-temperature (PVT) conditions on the chip. This makes the inverter-based ring oscillator 100 unsuitable for circuits (e.g., high-speed digital circuits) that require a highly accurate clock signal.

Another type of clock generator is a phase locked loop (PLL), which is able to provide a highly accurate clock signal across PVT conditions. However, a PLL comes with a large area and power overhead. In addition, a PLL often requires a voltage supply rail that is separate from the voltage supply rail used for digital circuits. The separate supply rail for the PLL takes extra routing space on the chip. A PLL also requires a custom analog implementation and is therefore less flexible for digital integration. In addition, an analog PLL often includes a high-speed voltage-controlled oscillator (VCO) which can generate noise in other parts of the frequency spectrum.

Aspects of the present disclosure overcome the above drawbacks of the inverter-based ring oscillator 100 and the PLL by providing a multiplexer-based ring oscillator in which multiplexers are used as delay elements instead of inventers. The multiplexers allow the clock frequency of the ring oscillator to be tuned (i.e., adjusted) dynamically by controlling the control lines of the multiplexers in the multiplexer chain, as discussed further below. Aspects of the present disclosure also provide a feedback control circuit configured to dynamically tune a clock frequency of the ring oscillator based on feedback of the clock frequency to maintain the clock frequency at a target clock frequency across PVT conditions, as discussed further below.

Figure 2A:
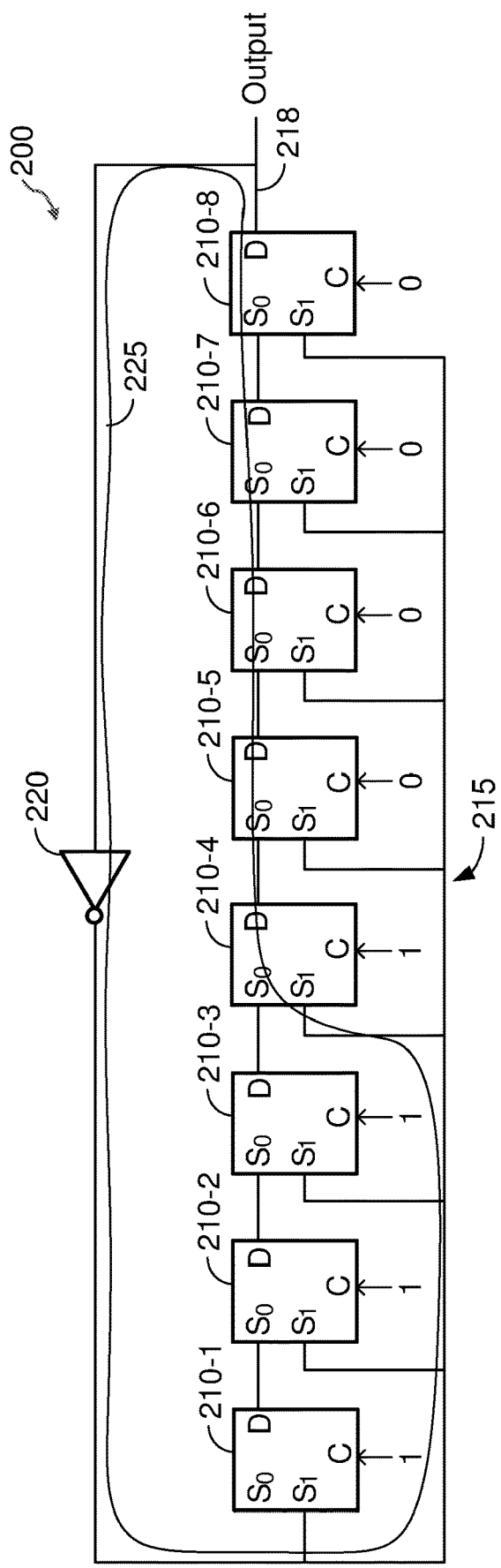
FIG. 2A shows an example of a multiplexer-based ring oscillator according to certain aspects of the present disclosure.

FIG. 2A shows an example of a ring oscillator 200 according to certain aspects of the present disclosure. The ring oscillator 200 is a multiplexer-based ring oscillator including a chain of multiplexers 210-1 to 210-8. Each of the multiplexers 210-1 to 210-8 has a first input (labeled "$S_0$"), a second input (labeled "$S_1$"), a control input (labeled "C"), and an output (labeled "D"). The first input $S_0$ of each of multiplexers 210-2 to 210-8 is coupled to the output D of the preceding multiplexer 210-1 to 210-7 in the multiplexer chain. The second input $S_1$ of each of multiplexers 210-1 to 210-8 is coupled to a bypass signal path 215, as shown in FIG. 2A. As discussed further below, the bypass signal path 215 allows one or more of the multiplexers 210-1 to 210-8 to be selectively bypassed to adjust the clock frequency of the ring oscillator 200. The output D of the last multiplexer 210-8 in the multiplexer chain is coupled to the bypass signal path 215 via an inverter 220. In the example in FIG. 2A, the output 218 of the ring oscillator 200 is taken at the output D of multiplexer 210-8. However, it is to be appreciated that the output 218 may also be taken at the output of the inverter 220. Although FIG. 2A shows an example in which the ring oscillator 200 includes eight multiplexers 210-1 to 210-8, it is to be appreciated that the ring oscillator 200 is not limited to this example and that the ring oscillator 200 may include a different number of multiplexers.

Each of the multiplexers 210-1 to 210-8 may be individually controlled by a respective control signal input to the respective control input. Each of the multiplexers 210-1 to 210-8 is configured to select the respective first input $S_0$ or the respective second input $S_1$ based on a control value of the respective control signal. In the example in FIG. 2A, the control value of each control signal is a bit value. In this example, each of the multiplexers 210-1 to 210-8 is configured to select the respective first input $S_0$ if the respective control value is zero and select the respective second input $S_1$ if the respective control value is one. However, it is to be appreciated that the multiplexers 210-1 to 210-8 are not limited to this example.

In operation, the clock frequency of the ring oscillator 200 is set by setting the control values of the control signals input to the multiplexers 210-1 to 210-8. FIG. 2A shows an example in which the control values for multiplexers 210-1 to 210-4 are set to one and the control values for multiplexers 210-5 to 210-8 are set to zero. In this example, each of multiplexers 210-1 to 210-4 selects the respective second input $S_1$, which is coupled to the bypass signal path 215. Each of multiplexers 210-5 to 210-8 selects the respective first input $S_0$, which is coupled to the output D of the preceding multiplexer in the multiplexer chain. This causes the oscillator signal to propagate in the oscillator loop path 225, in which the oscillator signal propagates through multiplexers 210-4 to 210-8 and bypasses multiplexers 210-1 to 210-3 using the bypass signal path 215. Thus, in this example, the delay of the ring oscillator 200 (and hence the clock frequency of the ring oscillator 200) includes the delays of the five multiplexers 210-4 to 210-8 through which the oscillator signal propagates. The clock frequency of the ring oscillator 200 is the frequency of the clock signal output by the ring oscillator 200.

Figure 2B:
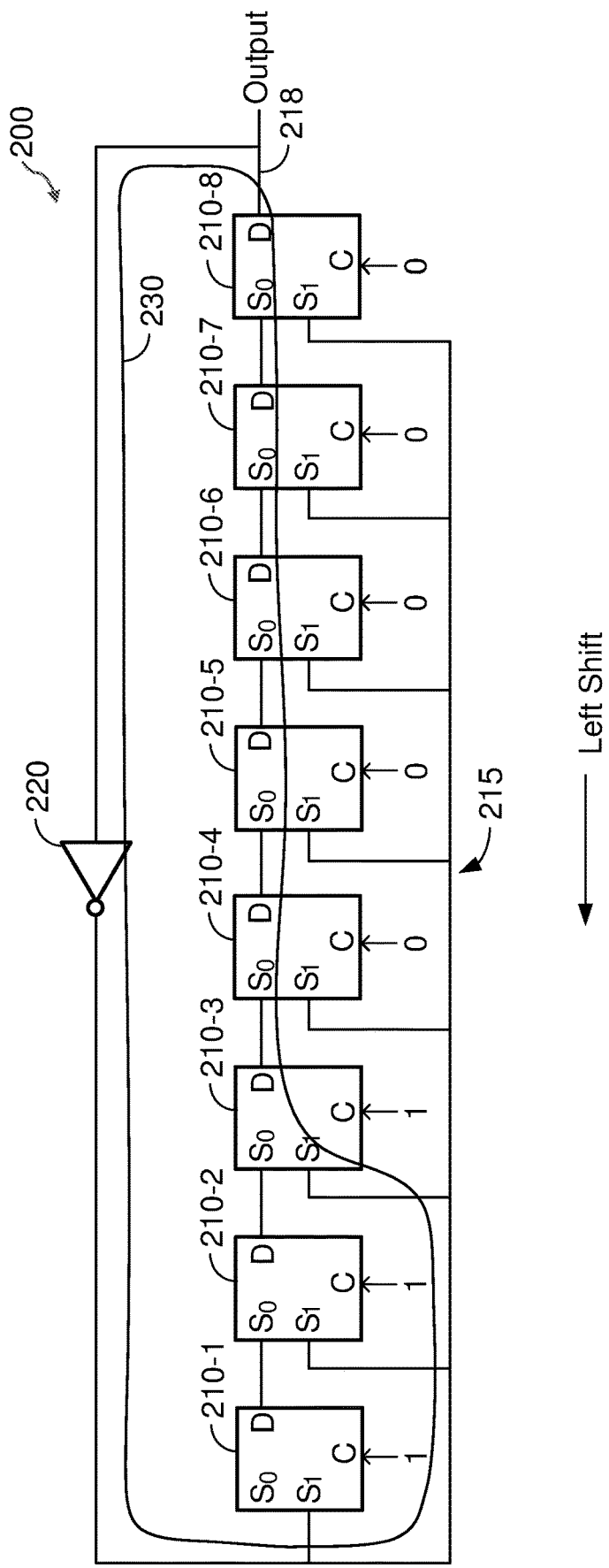
FIG. 2B shows an example in which the clock frequency of the multiplexer-based ring oscillator is decreased according to certain aspects of the present disclosure.

FIG. 2B shows an example in which the control value for multiplexer 210-4 is changed from one in FIG. 2A to zero while the control values for the other multiplexers 210-1 to 210-3 and 210-5 to 210-8 are unchanged. This change causes the oscillator signal to propagate through an additional multiplexer 210-3 compared with FIG. 2A, which increases the delay of the ring oscillator 200 by the delay of one multiplexer. The increased delay decreases the clock frequency of the ring oscillator 200. In this example, the oscillator loop path 230 propagates through one additional multiplexer (i.e., multiplexer 210-3) compared with the oscillator loop path 225 in FIG. 2A.

Figure 2C:
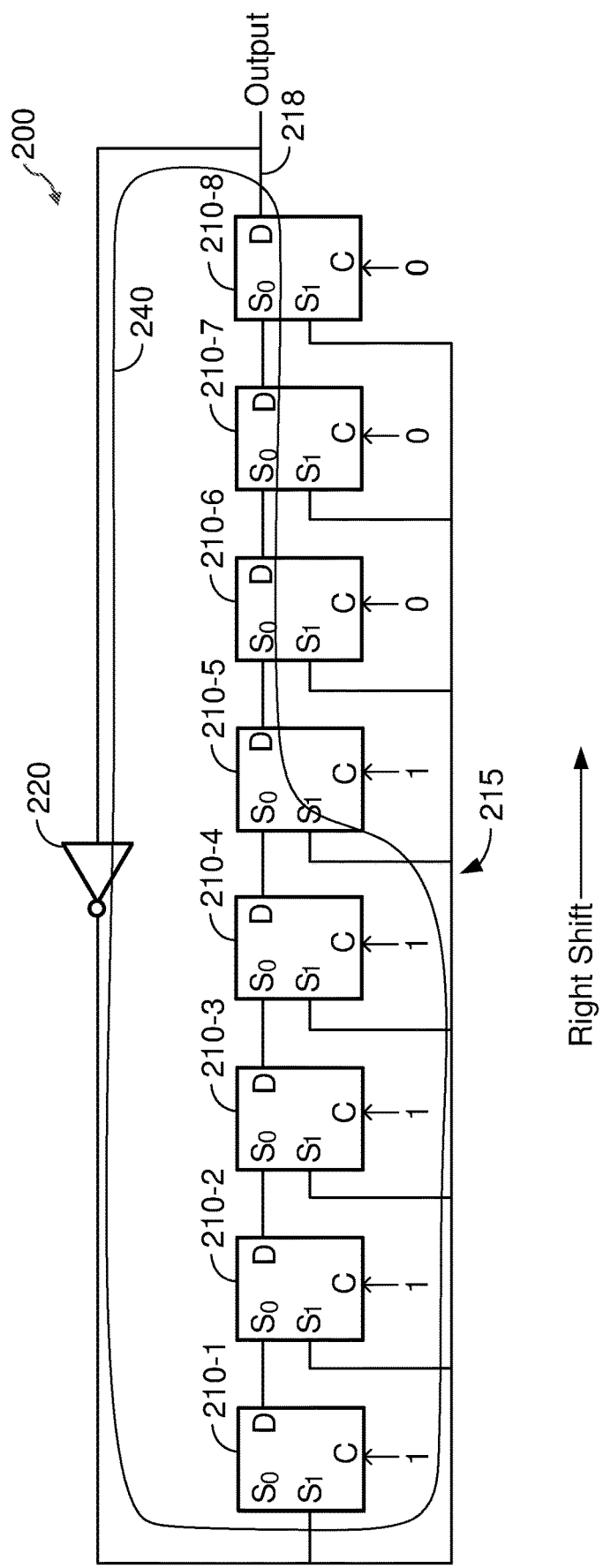
FIG. 2C shows an example in which the clock frequency of the multiplexer-based ring oscillator is increased according to certain aspects of the present disclosure.

FIG. 2C shows an example in which the control value for multiplexer 210-5 is changed from zero in FIG. 2A to one while the control values for the other multiplexers 210-1 to 210-4 and 210-6 to 210-8 are unchanged. This change causes the oscillator signal to bypass multiplexer 210-4, which decreases the delay of the ring oscillator 200 by the delay of one multiplexer. The decreased delay increases the clock frequency of the ring oscillator 200. In this example, the oscillator loop path 240 propagates through one less multiplexer compared with the oscillator loop path 225 in FIG. 2A.

Thus, the delay (and hence clock frequency) of the ring oscillator 200 can be tuned by changing the control value for one or more of the multiplexers 210-1 to 210-8 in the multiplexer chain. This is because the control values control the delay (and hence the clock frequency) of the ring oscillator 200 by controlling the number of multiplexers through which the oscillator signal of the ring oscillator 200 propagates.

An advantage of the ring oscillator 200 over the inverter-based ring oscillator 100 is that the clock frequency of the ring oscillator 200 can be tuned by changing one or more of the control values input to the multiplexers 210-1 to 210-8 in the ring oscillator 200. This allows a feedback control circuit to dynamically tune the clock frequency of the ring oscillator 200 to maintain a target clock frequency across PVT conditions. An example of a feedback control circuit is discussed below with reference to FIG. 3.

The ring oscillator 200 takes up less area and has less power overhead compared with a PLL. In addition, the ring oscillator 200 can be implemented with digital components. This allows the ring oscillator 200 to use the same voltage supply rail as digital circuits on the chip and makes implementation of the ring oscillator 200 less costly by not requiring the design and fabrication of custom analog components. Also, the ring oscillator 200 is capable of generating a high-speed clock signal without an even higher frequency VCO as needed by an analog PLL.

Figure 3:
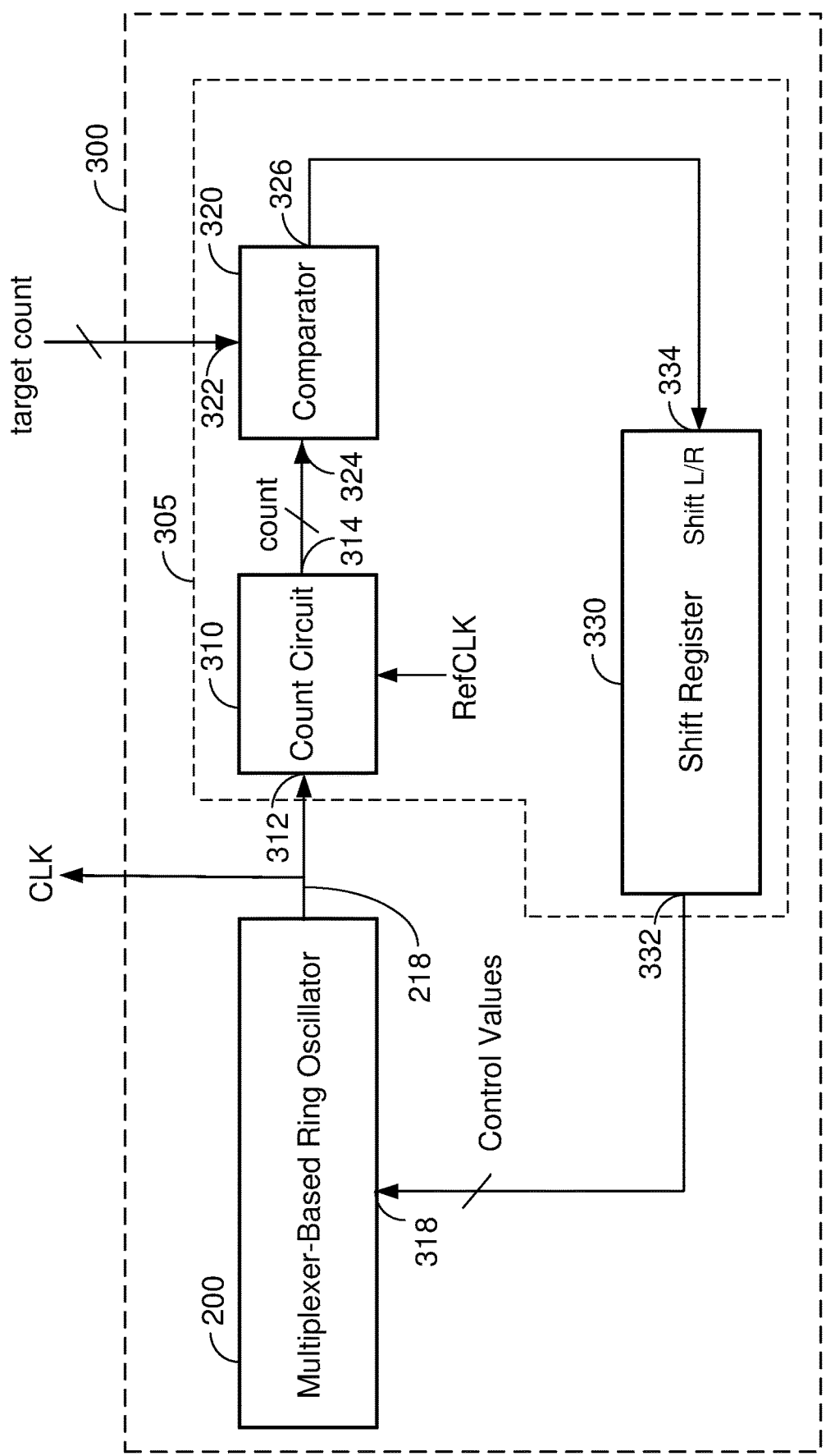
FIG. 3 shows an example of a clock generator including the multiplexer-based ring oscillator and a feedback control circuit according to certain aspects of the present disclosure.

FIG. 3 shows an example of a clock generator 300 including the ring oscillator 200 and a feedback control circuit 305 according to certain aspects. The feedback control circuit 305 is configured to dynamically tune the clock frequency of the ring oscillator 200 based on feedback of the clock frequency to maintain the clock frequency at a target clock frequency across PVT conditions, as discussed further below. In this example, the feedback control circuit 305 includes a count circuit 310, a comparator 320, and a shift register 330.

In this example, the shift register 330 includes an output 332 coupled to an input 318 of the ring oscillator 200. The input 318 of the ring oscillator 200 may include the control inputs of the multiplexers 210-1 to 210-8 (shown in FIGS. 2A to 2C) in the ring oscillator 200. In this example, the output 332 of the shift register 330 provides the control values for the multiplexers 210-1 to 210-8. Although FIG. 3 shows an example in which the output 332 of the shift register 330 is directly coupled to the input 318 of the ring oscillator 200, it is to be appreciated that this need not be the case. For example, the output 332 of the shift register 330 may be coupled to the input 318 of the ring oscillator 200 via latches to time the input of the control values (e.g., control bit values) from the shift register 330 to the multiplexers 210-1 to 210-8 (e.g., to prevent glitches in the ring oscillator 200).

The shift register 330 tunes the clock frequency of the ring oscillator 200 by shifting the control values in the shift register 330 to the right or left under the control of the comparator 320, as discussed further below. FIG. 2B shows an example in which the shift register 330 shifts the control values to the left by one shift position compared with FIG. 2A. This shift causes the control value for multiplexer 210-4 to change from one to zero, which increases the delay (and hence decreases the clock frequency) of the ring oscillator 200. FIG. 2C shows an example in which the shift register 330 shifts the control values in the shift register 330 to the right by one shift position compared with FIG. 2A. This shift causes the control value for multiplexer 210-5 to change from zero to one, which decreases the delay (and hence increases the clock frequency) of the ring oscillator 200. Thus, in this example, the shift register 330 decreases the clock frequency by shifting the control values to the left and increases the clock frequency by shifting the control values to the right.

The count circuit 310 includes an input 312 coupled to the output 218 of the ring oscillator 200 and an output 314. In operation, the count circuit 310 receives the clock signal ("CLK") output from the output 218 of the ring oscillator 200 at the input 312. The output 218 may be taken at the output of the last multiplexer 210-8 in the multiplexer chain, the output of the inverter 220, or somewhere else in the ring oscillator 200. The clock signal CLK is also output to one or more circuits (not shown in FIG. 3) for timing operations of the one or more circuits (e.g., digital circuits), as discussed further below.

The count circuit 310 counts the number of periods (i.e., cycles) of the clock signal CLK over a count time window and outputs a count value indicating the number of periods of the clock signal CLK counted over the count time window. In certain aspects, the count circuit 310 uses a reference clock signal to time the count time window. For example, the count circuit 310 may receive a reference clock signal ("RefCLK"), and use one period of the reference clock signal RefCLK as the count time window. In this example, the count circuit 310 outputs a count value indicating the number of periods of the clock signal CLK counted over one period of the reference clock signal RefCLK. The reference clock signal RefCLK may have a much lower frequency than the clock signal CLK output by the ring oscillator 200 and may be generated by a stable clock source (e.g., crystal oscillator).

The comparator 320 includes a first input 322, a second input 324, and an output 326. The first input 322 is configured to receive a target count value, and the second input 324 is coupled to the output 314 of the count circuit 310. The comparator 320 receives the count value from the count circuit 310 at the second input 324. The target count value corresponds to the target clock frequency and indicates what the count value from the count circuit 310 should equal when the clock frequency of the ring oscillator 200 is equal to the target clock frequency. The count value from the count circuit 310 is greater than the target count value when the clock frequency of the ring oscillator 200 is greater than the target clock frequency, and the count value from the count circuit 310 is less than the target count value when the clock frequency of the ring oscillator 200 is less than the target frequency. Thus, the comparison of the count value from the count circuit 310 with the target count value indicates whether the clock frequency of the ring oscillator 200 needs to be tuned (i.e., adjusted) to meet the target clock frequency, and the direction in which the clock frequency of the ring oscillator 200 needs to be tuned (i.e., adjusted).

In certain aspects, the comparator 320 generates a shift control signal based on the comparison indicating a right shift, a left shift, or no shift, and outputs the shift control signal at the output 326, which is coupled to a shift control input 334 of the shift register 330. If the count value from the count circuit 310 is greater than the target count value (i.e., the clock frequency of the ring oscillator 200 is greater than the target clock frequency), then the shift control signal has a first value indicating a left shift. In this case, the shift register 330 shifts the control values in the shift register 330 to the left to decrease the clock frequency of the ring oscillator 200. If the count value from the count circuit 310 is less than the target count value (i.e., the clock frequency of the ring oscillator 200 is less than the target clock frequency), then the shift control signal has a second value indicating a right shift. In this case, the shift register 330 shifts the control values in the shift register 330 to the right to increase the clock frequency of the ring oscillator 200. If the count value from the count circuit 310 is equal to the target count value (i.e., the clock frequency of the ring oscillator 200 is approximately equal to the target clock frequency), then the shift control signal has a third value indicating no shift. In this case, the shift register 330 does not perform a shift.

The feedback control circuit 305 may tune the clock frequency of the ring oscillator 200 once per update period where one update period may equal one or more periods of the reference clock RefCLK. For each update, the count circuit 310 counts the number of periods of the clock signal CLK output by the ring oscillator 200 over the count time window (e.g., one period of the reference clock RefCLK), and the comparator 320 compares the count value from the count circuit 310 with the target count value and outputs a shift control signal instructing the shift register 330 to shift either to the left or to the right based on the comparison if the count value from the count circuit 310 does not equal the target count value. In this manner, the feedback control circuit 305 is able to dynamically tune the clock frequency of the ring oscillator 200 based on feedback of the clock frequency under various PVT conditions to maintain the clock frequency of the ring oscillator 200 at the target clock frequency across PVT conditions.

Figure 4A:
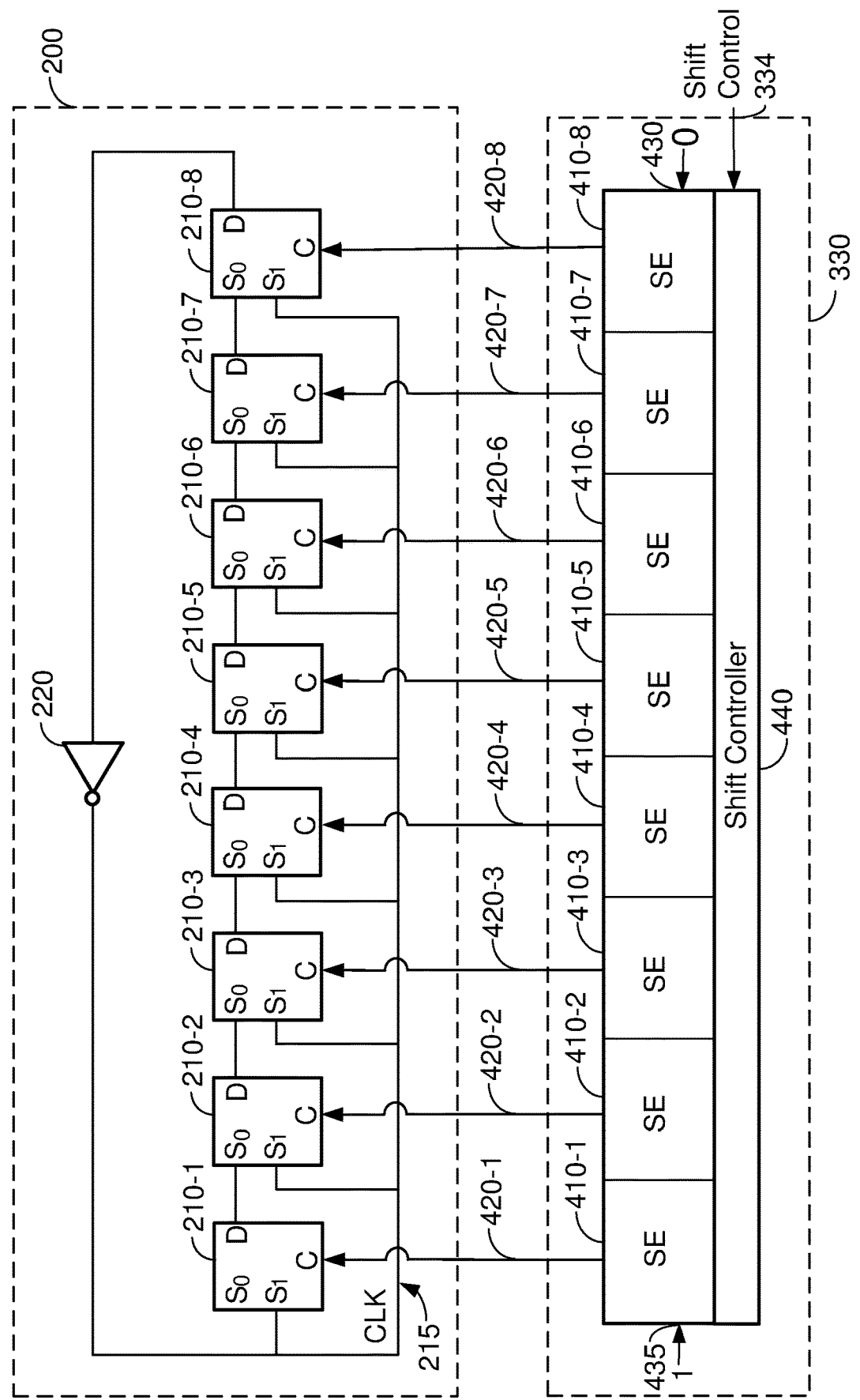
FIG. 4A shows an exemplary implementation of a shift register according to certain aspects of the present disclosure.

FIG. 4A shows an exemplary implementation of the shift register 330 according to certain aspects of the present disclosure. In this example, the shift register 330 includes storage elements 410-1 to 410-8, and a shift controller 440. Each of the storage elements 410-1 to 410-8 is configured to store one of the control values in the shift register 330, and is coupled to the control input of the respective one of the multiplexers 210-1 to 210-8 via a respective control line 420-1 to 420-8. The storage elements 410-1 to 410-8 may be implemented with flip-flops coupled in series.

The shift register 330 has a first input 430 coupled to storage element 410-8, and a second input 435 coupled to storage element 410-1. In the example in FIG. 4A, a control value of zero is input to the first input 430, and a control value of one is input to the second input 435. The shift controller 440 is configured to receive the shift control signal from the comparator 320 (shown in FIG. 3) at the shift control input 334, and control shifting of the shift register 330 based on the shift control signal from the comparator 320, as discussed further below. The shift control signal may be sent from the comparator 320 to the shift register 330 over one or more signal lines.

In the example in FIG. 4A, the shift register 330 is a bidirectional shift register capable of shifting in either direction (i.e., left or right). The shift register 330 is also a series in, parallel out shift register. This is because values are input to the shift register 330 serially at the first input 430 or the second input 435, and the control values stored (i.e., held) in the storage elements 410-1 to 410-8 are output to the respective multiplexers 210-1 to 210-8 in parallel via the respective control lines 420-1 to 420-8. In this example, the output 332 of the shift register 330 shown in FIG. 3 is a parallel output.

The shift controller 440 is configured to receive the shift control signal from the comparator 320 via the shift control input 334. If the shift control signal has the first value indicating a left shift, then the shift controller 440 shifts the control values in the storage elements 410-1 to 410-8 to the left by one shift position. In this case, the control value in each of storage elements 410-2 to 410-8 is shifted to the adjacent storage element to the left. For example, the control value in storage element 410-8 is shifted to storage element 410-7. In addition, the control value of zero at the first input 430 is shifted to the left into the storage element 410-8 (e.g., LSB of the shift register 330).

If the shift control signal has the second value indicating a right shift, then the shift controller 440 shifts the control values in the storage elements 410-1 to 410-8 to the right by one shift position. In this case, the control value in each of storage elements 410-1 to 410-7 is shifted to the adjacent storage elements to the right. For example, the control value in storage element 410-7 is shifted to storage element 410-8. In addition, the control value of one at the second input 435 is shifted to the right into storage element 410-1 (e.g., MSB of the shift register).

If the shift control signal has the third value indicating no shift, then the shift controller 440 does not shift the control values in the storage elements 410-1 to 410-8. In this case, there is no shift.

In one example, the control values in the storage elements 410-1 to 410-8 may be set according to a nominal pattern at startup in which the first of half of the control values are ones and the remaining half of the control values are zeros. Thus, in this example, half of the multiplexers 210-1 to 210-8 are selected for delay and the remaining half of the multiplexers 210-1 to 210-8 are bypassed at startup. In this example, the control values in the storage elements 410-1 to 410-8 may be set according to the nominal pattern using a parallel load or a select/reset combination.

Figure 4B:
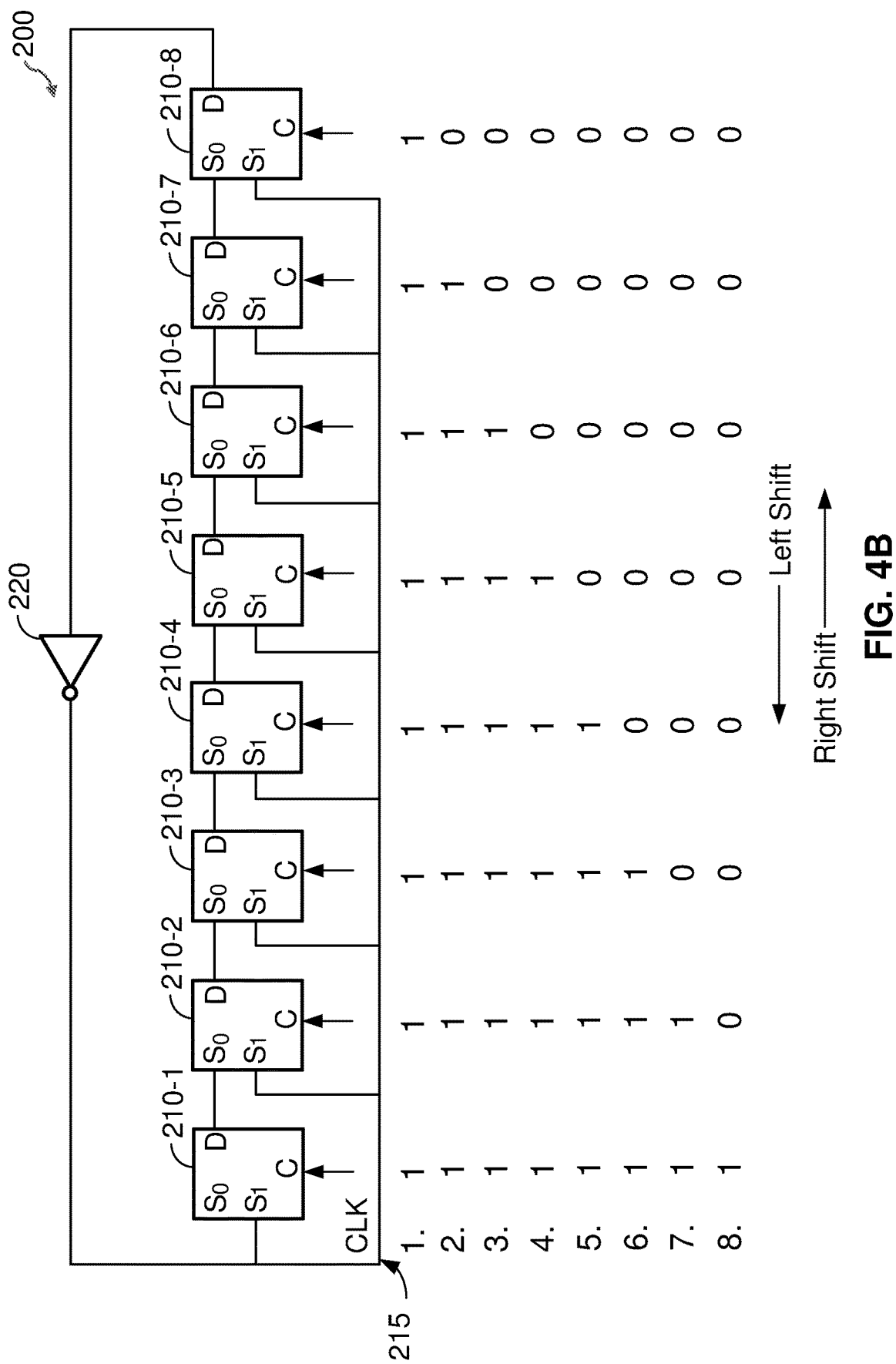
FIG. 4B shows an example in which control values for the multiplexer-based ring oscillator are shifted according to certain aspects of the present disclosure.

Exemplary operations of the shift register 330 in FIG. 4A will now be discussed according certain aspects with reference to FIG. 4B. FIG. 4B shows eight rows of exemplary control values, in which the rows are numbered 1 to 8. In this example, each control value is a bit value. Each row of control values shows an example of control values that may be stored in the storage elements 410-1 to 410-8 of the shift register 330 at a given instance in time. Each control value in each row is aligned vertically with the corresponding multiplexer 210-1 to 210-8 in FIG. 4B. As discussed above, the shift register 330 may shift the control values in the storage elements 410-1 to 410-8 to the left or to the right by one shift position in an update period to adjust the clock frequency of the ring oscillator 200. When the shift register 330 shifts the control values to the left by one shift position, the control value for one of the multiplexers 210-1 to 210-8 changes. The change in the control value is shown in FIG. 4B by moving down one row. For example, if the control values in the shift register 330 start with the control values shown in row three, then the control values after the shift to the left are shown in row four. In this example, the control value for multiplexer 210-6 changes from one to zero. Similarly, when the shift register 330 shifts the control values to the right by one position, the control value for one of the multiplexers 210-1 to 210-8 changes. The change in the control value is shown in FIG. 4B by moving up one row. For example, if the control values in the shift register 330 start with the control values shown in row five, then the control values after the shift to the right are shown in row four. In this example, the control value for multiplexer 210-5 changes from zero to one.

Thus, in the example illustrated in FIGS. 4A and 4B, the shift controller 440 shifts the control values to the left to decrease the clock frequency of the ring oscillator 200 and shifts the control values to the right to increase the clock frequency of the ring oscillator 200. However, it is to be appreciated the present disclosure is not limited to this example. In other implementations, the shift controller 440 may shift the control values to the right to decrease the clock frequency and shift the control values to the left to increase the clock frequency. In general, the comparator 320 is configured to output a shift control signal having a first value indicating a first shift direction if the count value from the count circuit 310 is greater than the target count value, and output a shift control signal having a second value indicating a second shift direction if the count value from the count circuit 310 is less than the target count value, wherein the second shift direction is opposite the first shift direction. Also, the shift register 330 is configured to shift the control values in the first shift direction if the shift control signal has the first value, and shift the control values in the second shift direction if the shift control signal has the second value.

In the examples shown in FIGS. 2A-2C and 4B, the control values input to the multiplexers 210-1 to 210-8 have a specific pattern of ones followed by zeros. This pattern allows the clock generator 300 to achieve glitchless dynamic tuning of the ring oscillator 200. Use of the shift register 330 storing control values of this pattern means that only one of the control values in the pattern changes at a time during tuning which significantly reduces the chances of glitches compared with the case where multiple control values change at a time. Changing multiple control values at a time can lead to large abrupt changes in the delays of the ring oscillator 200, which causes glitches.

Figure 5:
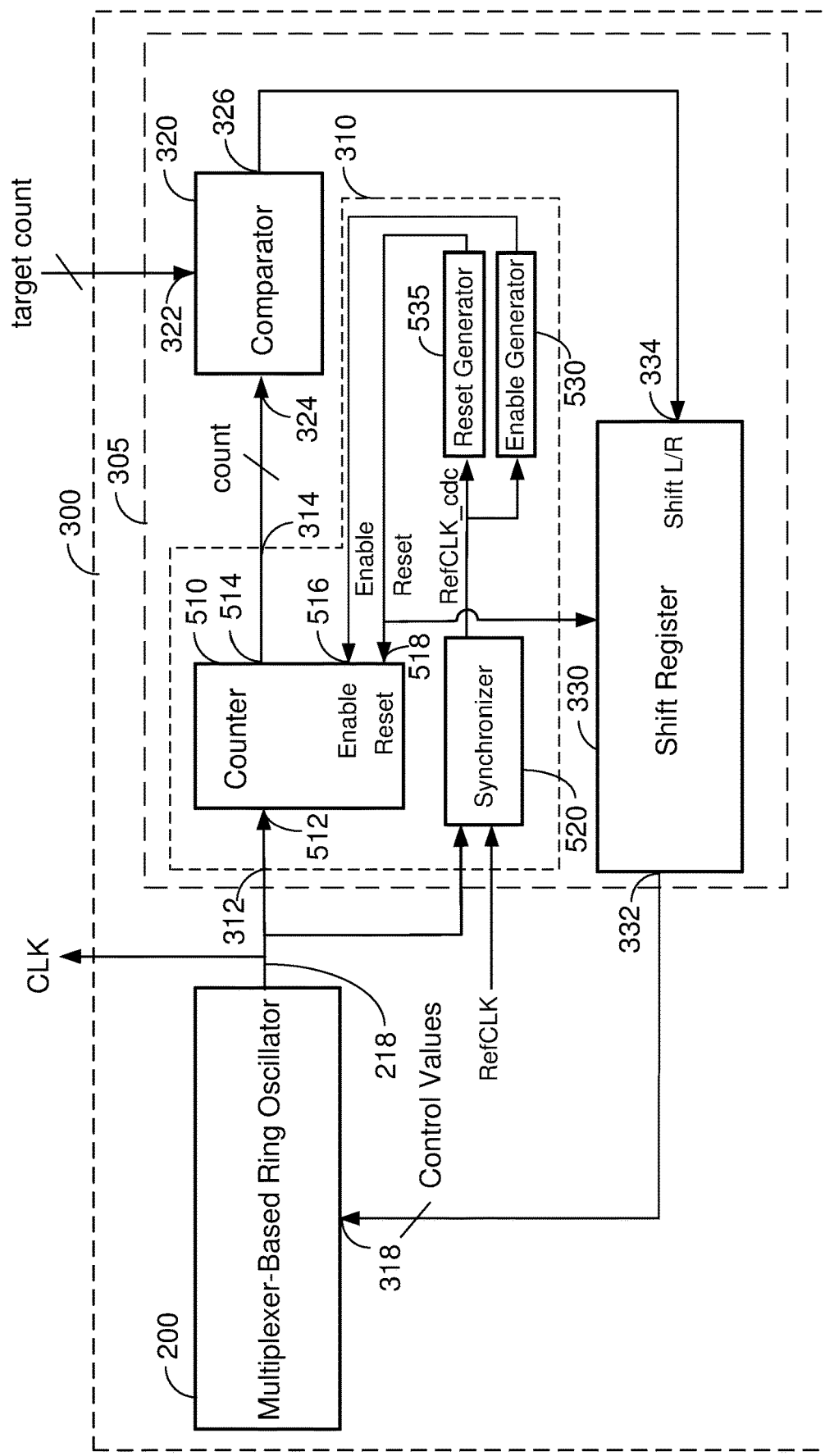
FIG. 5 shows an exemplary implementation of a count circuit in the feedback control circuit according to certain aspects of the present disclosure.

FIG. 5 shows an exemplary implementation of the count circuit 310 according to certain aspects. In this example, the count circuit 310 includes a counter 510, a synchronizer 520, an enable generator 530, and a reset generator 535.

The counter 510 has an input 512 coupled to the output 218 of the ring oscillator 200, an output 514 coupled to the second input 324 of the comparator 320, an enable input 516, and a reset input 518. In one example, the counter 510 is enabled when a logic one is input to the enable input 516 and disabled when a logic zero is input to the enable input 516. When the counter 510 is enabled, the counter 510 counts the periods (i.e., cycles) of the clock signal CLK received at the input 512, and outputs a count value at the output 514 indicating the number of periods of the clock signal CLK that have been counted. As discussed further below, the counter 510 may be enabled for one period of the reference clock signal RefCLK so that the count value indicates the number of periods of the clock signal CLK counted over one period of the reference clock signal RefCLK. When the counter 510 is disabled, the counter 510 may hold the current count value and output the current count value at the output 514 until the counter 510 is reset. In one example, the counter 510 is reset when a logic one is input to the reset input 518. When the counter 510 is reset, the count value may be reset to zero.

The clock signal CLK from the ring oscillator 200 and the reference clock signal RefCLK are input to the synchronizer 520. The synchronizer 520 is configured to synchronize the reference clock signal RefCLK with the clock signal CLK to generate a synchronized reference clock signal ("RefCLK_cdc"), and output the synchronized reference clock signal to the enable and reset generator 535. In one example, the synchronizer 520 may be implemented with a synchronizer flop that samples the reference clock signal RefCLK on an edge of the clock signal CLK to generate the synchronized reference clock signal RefCLK_cdc.

The enable generator 530 is configured to generate an enable signal ("Enable") from the synchronized reference clock signal RefCLK_cdc. The enable signal is input to the enable input 516 of the counter 510. In one example, the enable generator 530 generates the enable signal by dividing the frequency of the synchronized reference clock signal RefCLK_cdc by two. An example of this is shown in the timing diagram in FIG. 6, which shows an example of the synchronized reference clock signal RefCLK_cdc and the enable signal. In this example, the enable signal has half the frequency of the synchronized reference clock signal RefCLK_cdc. As a result, the enable signal is high (i.e., logic one) during every other period of the synchronized reference clock signal RefCLK_cdc, and therefore enables the counter 510 during every other period of the synchronized reference clock signal RefCLK_cdc. This causes the counter 510 to count the number of periods of the clock signal CLK in every other period of the synchronized reference clock signal RefCLK_cdc. In this example, the enable generator 530 may be implemented with a divide-by-two frequency divider. In this example, the count time window is approximately equal to one period of the reference clock signal RefCLK, assuming the reference clock signal RefCLK and the synchronized reference clock signal RefCLK_cdc have approximately the same period.

Figure 6:
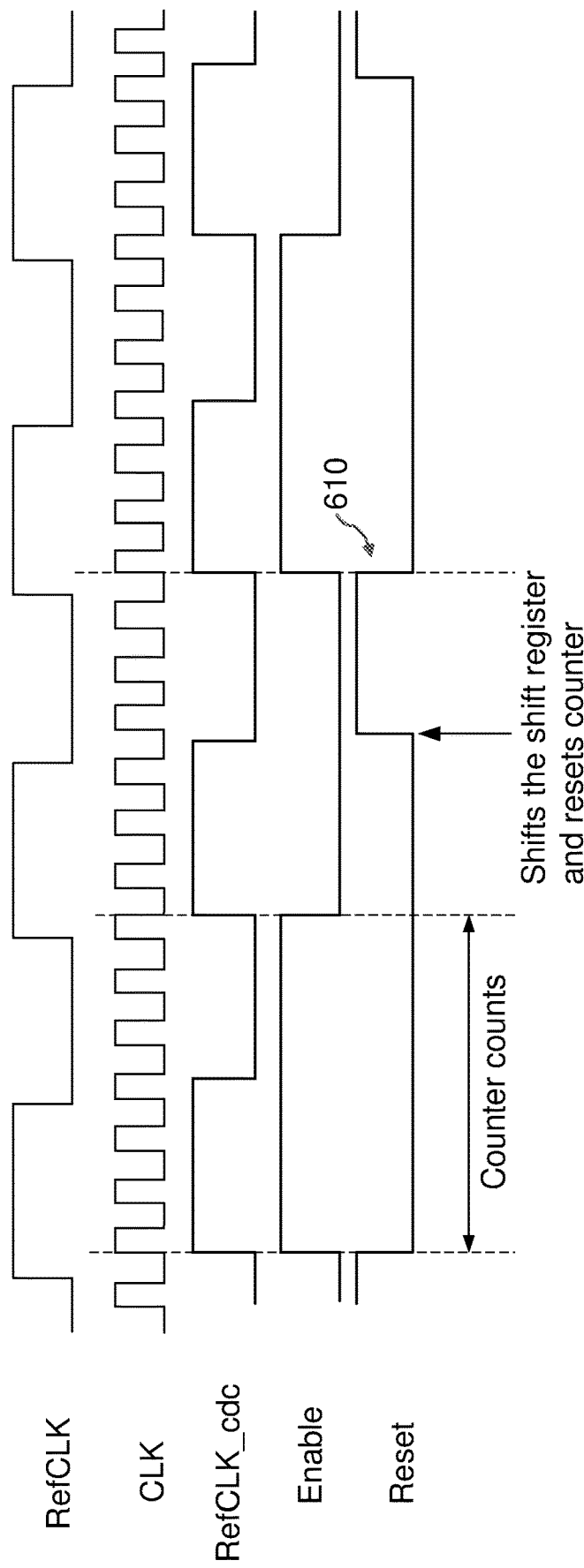
FIG. 6 is a timing diagram illustrating exemplary signals in the feedback control circuit according to certain aspects of the present disclosure.

The reset generator 535 generates a reset signal ("Reset") from the synchronized reference clock signal RefCLK_cdc. The reset signal is input to the reset input 518 of the counter 510. The reset generator 535 generates the reset signal such that the reset signal has a positive pulse 610 during a time that the enable signal is low, as shown in FIG. 6. Thus, the reset signal resets the counter 510 after the counter 510 has counted the number of periods of the clock signal CLK in the previous period of the synchronized reference clock signal RefCLK_cdc. Resetting the counter 510 resets the count value for the next period of the synchronized reference clock signal RefCLK_cdc. It is to be appreciated that the reset generator 535 may share one or more components with the enable generator 530.

In this example, the comparator 320 compares the count value of the counter 510 during a time that the enable signal is low and before the reset signal goes high. This gives the comparator 320 time to compare the count value from the counter 510 (which indicates the number of periods of the clock signal CLK counted over the previous period of synchronized reference clock signal RefCLK_cdc) with the target count value. Based on the comparison, the comparator 320 outputs a shift control signal to the shift register 330 indicating a left shift, a right shift, or no shift.

In the example in FIG. 5, the shift register 330 also receives the reset signal. When the reset signal goes high, the shift register 330 shifts the control values in the shift register 330 to the left if the shift control signal indicates a left shift, and shifts the control values in the shift register 330 to the right if the shift control signal indicates a right shift. The shift register 330 does not shift the control values if the shift control signal indicates no shift. For the example in which the storage elements 410-1 to 410-8 of the shift register 330 are implemented with flip-flops, the flip-flops may be clocked using the reset signal. In this example, the reset signal acts as a clock signal in which the shift register 330 performs a shift operation on a rising edge of the reset signal. In the example shown in FIG. 6, the reset signal acts as a clock signal having half the frequency of the reference clock signal RefCLK.

In the above example, one update period of the feedback control circuit 305 includes a first period and a second period, in which each of the first and second periods may correspond to a respective one of two consecutive periods of the synchronized reference clock signal RefCLK_cdc. During the first period of the update period, the counter 510 is enabled by the enable signal and counts the number of periods of the clock signal CLK. At the end of the first period, the counter 510 outputs a count value indicating the number of periods of the clock signal CLK counted over the first period. During the second period of the update period, the comparator 320 compares the count value with the target count value, and outputs a shift control signal to the shift register 330 based on the comparison indicating a left shift, a right shift, or no shift.

In the above example, one update period of the feedback control circuit 305 is approximately equal to two periods of the reference clock signal RefCLK, assuming the reference clock signal RefCLK and the synchronized reference clock signal RefCLK_cdc have approximately the same period. However, it is to be appreciated that the feedback control circuit 305 is not limited to this example. In general, one update period of the feedback control circuit 305 may be approximately equal to one or more periods of the reference clock signal RefCLK.

In the above example, the count circuit 310 counts the number of periods of the clock signal CLK over one period of the reference clock signal RefCLK. However, it is to be appreciated that the feedback control circuit 305 is not limited to this example. In another example, the count circuit 310 may count the number of periods of the clock signal CLK over two periods of the reference clock signal RefCLK. In this example, the enable generator 530 may divide the frequency of the synchronized reference clock signal RefCLK_cdc by four to generate the enable signal so that the counter 510 is enabled for approximately two periods the synchronized reference clock signal RefCLK. Also, in this example, one update period may approximately equal four periods of the synchronized reference clocks signal RefCLK_cdc. As discussed above, in general, the count circuit 310 counts the number of periods of the clock signal CLK over a count time window, which may be equal to one or more periods of the reference clock signal RefCLK.

Figure 7:
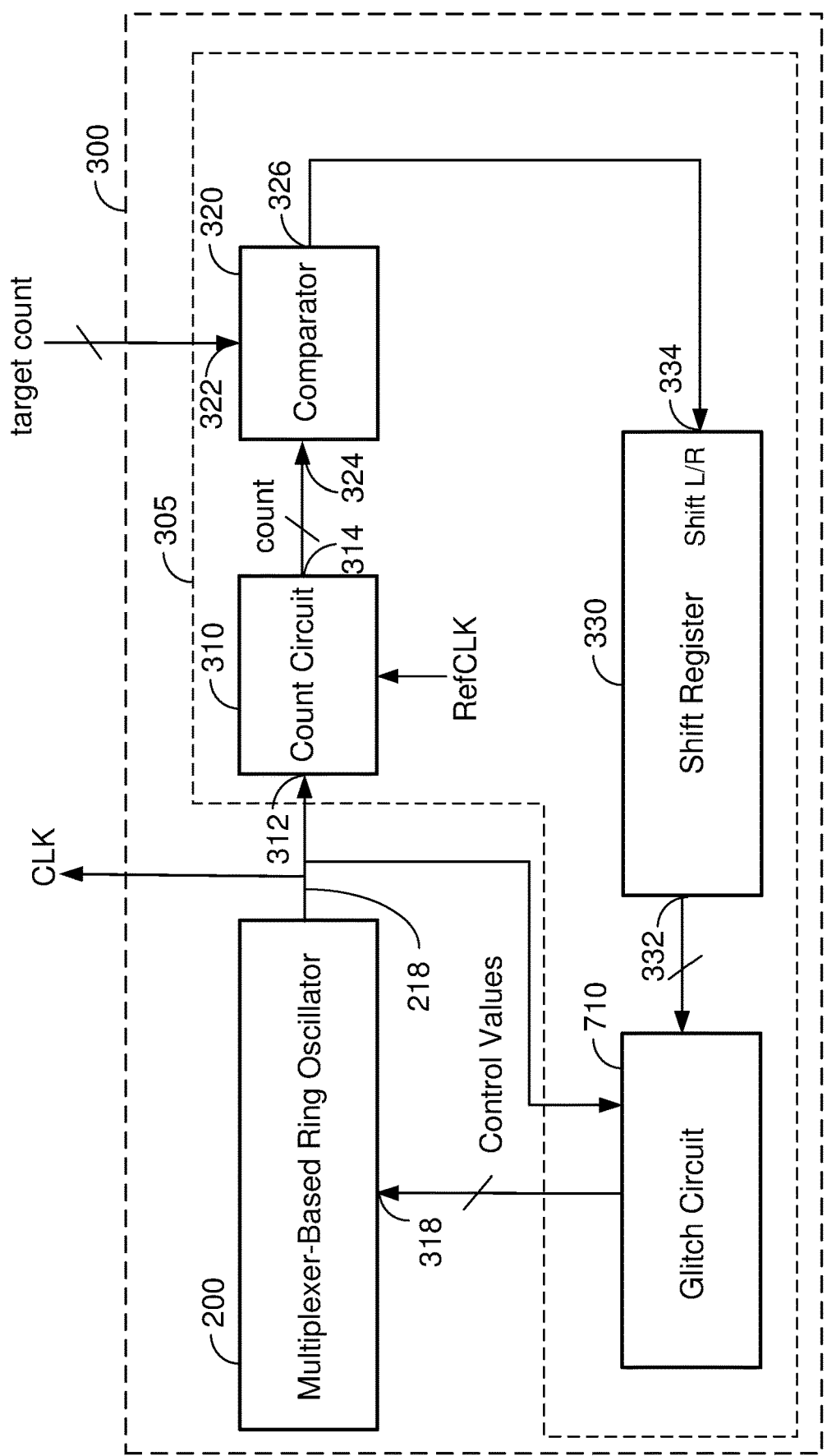
FIG. 7 shows an example of the feedback control circuit including a glitch circuit to prevent glitches in the multiplexer-based ring oscillator according to certain aspects of the present disclosure.

FIG. 7 shows an example in which the feedback control circuit 305 includes a glitch circuit 710 coupled between the output 332 of the shift register 330 and the control inputs of the multiplexers 210-1 to 210-8 (shown in FIGS. 2A to 2C) according to certain aspects of the present disclosure. The glitch circuit 710 receives the control values for the multiplexers 210-1 to 210-8 from the shift register 330. The glitch circuit 710 is configured to time the input of the control values from the shift register 330 to the control inputs of the respective multiplexers 210-1 to 210-8 to prevent glitches in the ring oscillator 200.

In one example, when the control value for one of the multiplexers 210-1 to 210-8 changes (e.g., due to a shift to the right or the left in the shift register 330), the glitch circuit 710 times the input of the control value change to the respective multiplexer to prevent a glitch from occurring. More particularly, the glitch circuit 710 times the input of the control value change to the respective multiplexer (i.e., respective one of the multiplexers 210-1 to 210-8) such that the control value change occurs during a glitch-free time window in which both inputs $S_0$ and $S_1$ of the respective multiplexer have the same logic value (i.e., logic state). Having the multiplexer switch inputs $S_0$ and $S_1$ when both inputs $S_0$ and $S_1$ have the same logic value prevents generation of a glitch. Note that a glitch is generated when a multiplexer switches inputs $S_0$ and $S_1$ at a time when the inputs $S_0$ and $S_1$ have different logic values (i.e., different logic states).

Figure 8A:
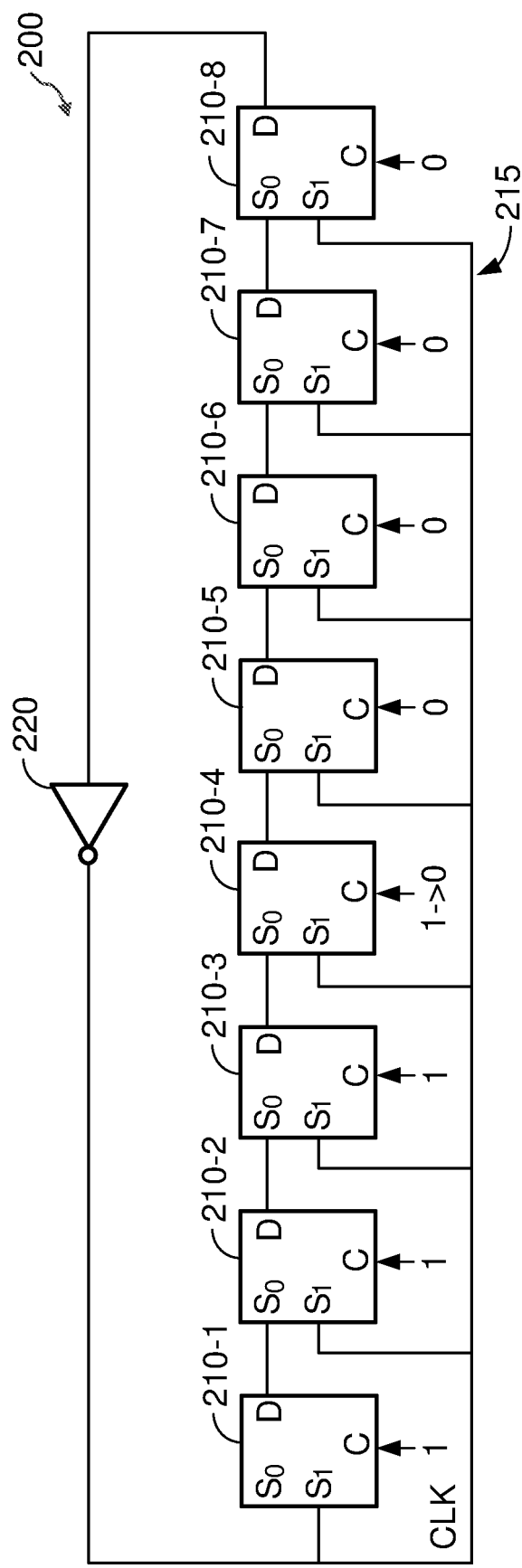
FIG. 8A shows an example in which the control value of one of the multiplexers in the multiplexer-based ring oscillator is changed according to certain aspects of the present disclosure.

As discussed above, the glitch circuit 710 may time the input of a control value change to one of the multiplexer 210-1 to 210-8 in the ring oscillator 200 to prevent a glitch from occurring. An example of the timing of a control value change to prevent a glitch will now be discussed with reference to FIGS. 8A and 8B. FIG. 8A shows an example in which the control values for multiplexers 210-1 to 201-3 are set to one, and the control values for multiplexers 210-5 to 210-8 are set to zero. In this example, the control value for multiplexer 210-4 changes from one to zero, which corresponds to the shift register 330 shifting the control values in the shift register 330 to the left by one shift position.

Figure 8B:
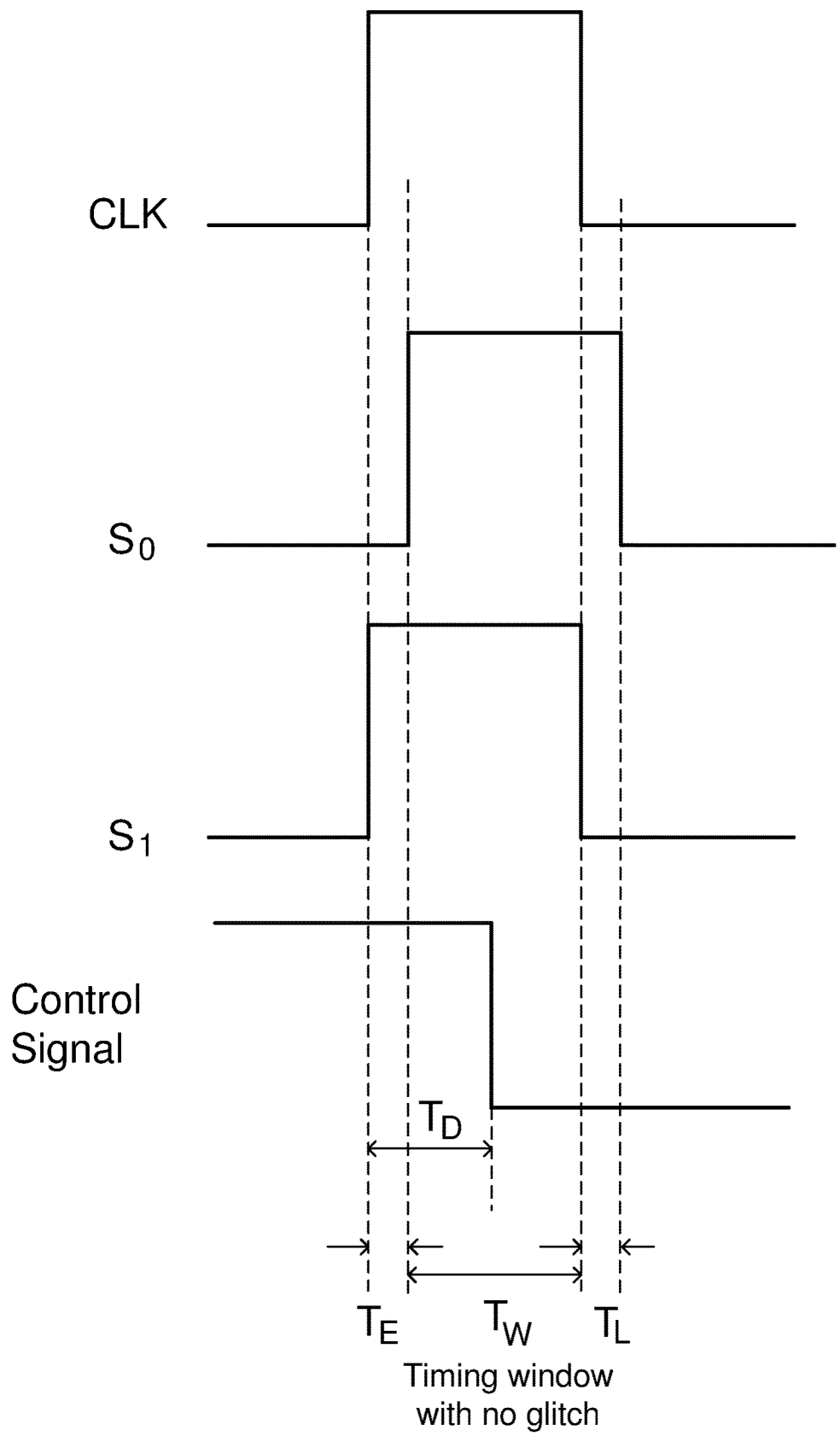
FIG. 8B is a timing diagram in which the input of the control value change in FIG. 8A is timed to prevent a glitch according to certain aspects of the present disclosure.

FIG. 8B is a timing diagram showing an example of the clock signal CLK, the signal ("$S_0$") at the first input $S_0$ of multiplexer 210-4, the signal ("$S_1$") at the second input $S_1$ of multiplexer 210-4, and the control signal at the control input of multiplexer 210-4. The second input $S_1$ of multiplexer 210-4 is coupled to the bypass signal path 215. Assuming the delay in the bypass signal path 215 is negligible, the signal at the second input $S_1$ of multiplexer 210-4 is the same as the clock signal CLK. The signal at the first input $S_0$ of multiplexer 210-4 is a delayed version of the clock signal CLK. More particularly, the signal at the first input $S_0$ of multiplexer 210-4 is delayed by approximately one multiplexer delay with respect to the clock signal CLK. This is because the signal at the first input $S_0$ of multiplexer 210-4 propagates through the preceding multiplexer 210-3 in the multiplexer chain, and is therefore delayed by one multiplexer delay. In this disclosure, a "multiplexer delay" is the delay between an input and an output of a multiplexer.

In this example, the signal at the first input $S_0$ of multiplexer 210-4 is shifted with respect to the signal at the second input $S_1$ of multiplexer 210-4 by approximately one multiplexer delay. This creates an early glitch time window ("$T_E$") and a late glitch time window ("$T_L$") in which the inputs $S_0$ and $S_1$ of multiplexer 210-4 have different logic values. The glitch time windows $T_E$ and $T_L$ each have a time duration of approximately one multiplexer delay. Since the inputs $S_0$ and $S_1$ of multiplexer 210-4 have different logic values during the glitch time windows $T_E$ and $T_L$, it is desirable for the glitch circuit 710 to avoid inputting the control signal change to the control input of multiplexer 210-4 during either the early glitch time window $T_E$ or the late glitch time window $T_L$.

Between the early glitch time window $T_E$ and the late glitch time window $T_L$ is a glitch-free time window ("$T_W$") in which both inputs $S_0$ and $S_1$ of multiplexer 210-4 have the same logic value (i.e., one in the example in FIG. 8B). Therefore, the glitch circuit 710 can prevent a glitch by inputting the control signal change to the control input of multiplexer 210-4 during the glitch-free time window $T_W$. In this regard, FIG. 8B shows an example in which the glitch circuit 710 changes the control value of the control signal input to multiplexer 210-4 from one to zero at approximately the center of the glitch-free time window $T_W$ to prevent a glitch.

In certain aspects, the glitch circuit 710 may time the control value change using the clock signal CLK as a timing reference. For example, the glitch circuit 710 may detect an edge of the clock signal CLK, and input the control value change to multiplexer 210-4 after a time delay ("$T_D$") from the detected edge of the clock signal CLK. The time delay $T_D$ is set such that the control value change occurs within the glitch-free time window $T_W$ (e.g., at approximately the center of the glitch-free time window $T_W$). The time delay $T_D$ may be determined via computer simulations of the ring oscillator 200, timing measurements of the ring oscillator 200, etc. In one example, the time delay $T_D$ may be approximately equal to a quarter of a period of the clock signal CLK.

There is also a glitch-free time window after the late glitch time window $T_L$ in which both inputs $S_0$ and $S_1$ of multiplexer 210-4 have the same logic value (i.e., zero in the example in FIG. 8B). It is to be appreciated that, in some implementations, the glitch circuit 710 may input the control value change to multiplexer 210-4 during this glitch-free time window. Thus, it is to be understand that a "glitch-free time window" may refer to the glitch-free time window $T_W$ between the early glitch time window $T_E$ and the late glitch time window $T_L$ or the glitch-free time window after the late glitch time window $T_L$ unless stated otherwise. Although FIG. 8B shows an example in which the control value change approximately at the center of the glitch-free time window, it is to be appreciated that the present disclosure is not limited to this example and that the control value change may be located at other positions within the glitch-free time window.

In the example in FIGS. 8A and 8B, the control value of the multiplexer 210-3 preceding multiplexer 210-4 in the multiplexer chain is set to one. This causes the preceding multiplexer 210-3 to select the bypass signal path 215. As a result, the signal input to the first input $S_0$ of multiplexer 210-4 is delayed by one multiplexer delay (i.e., the delay of multiplexer 210-3) relative to the signal input to the second input $S_1$ of multiplexer 210-4 from the bypass signal path 215. This reduces the duration (i.e., length) of each of the glitch time windows $T_E$ and $T_L$ to approximately one multiplexer delay, which, in turn, increases the duration (i.e., length) of the glitch-free time window $T_W$. The larger glitch-free time window $T_W$ makes it easier for the glitch circuit 710 to time the input of the control value change to multiplexer 210-4 to avoid a glitch.

In certain aspects, each time the shift register 330 changes the control value of one of the multiplexers 210-1 to 210-8 in an update period by shifting the control values in the shift register 330 to the left or to the right by one shift position, the preceding multiplexer in the multiplexer chain selects the bypass signal path 215. This may be demonstrated with reference to FIG. 4B. For example, when the shift register 330 starts with the control values in row three and shifts to the left by one shift position, the control value of multiplexers 210-6 changes from one to zero, and the control value of the preceding multiplexer 210-5 is set to one (i.e., the preceding multiplexer 210-5 selects the bypass signal path 215). In another example, when the shift register 330 starts with the control values in row five and shifts to the right by one shift position, the control value of multiplexer 210-5 changes from zero to one, and the control value of the preceding multiplexer 210-4 is set to one (i.e., the preceding multiplexer 210-4 selects the bypass signal path 215).

Having the preceding multiplexer in the multiplexer chain select the bypass signal path 215 facilitates the prevention of glitches in the ring oscillator 200. This is because having the preceding multiplexer select the bypass signal path 215 decreases the duration of each of the early and late glitch time windows $T_E$ and $T_W$ to one multiplexer delay, which increases the duration (i.e., length) of the glitch-free time window $T_W$ as discussed above. The longer glitch-free time window $T_W$ makes it easier for the glitch circuit 710 to time the input of a control signal change to avoid a glitch. In addition, this feature allows the glitch circuit 710 to use the same timing for each control value change to prevent a glitch (e.g., using the exemplary time delay $T_D$ shown in FIG. 8B), which reduces the complexity of the glitch circuit 710.

Figure 9:
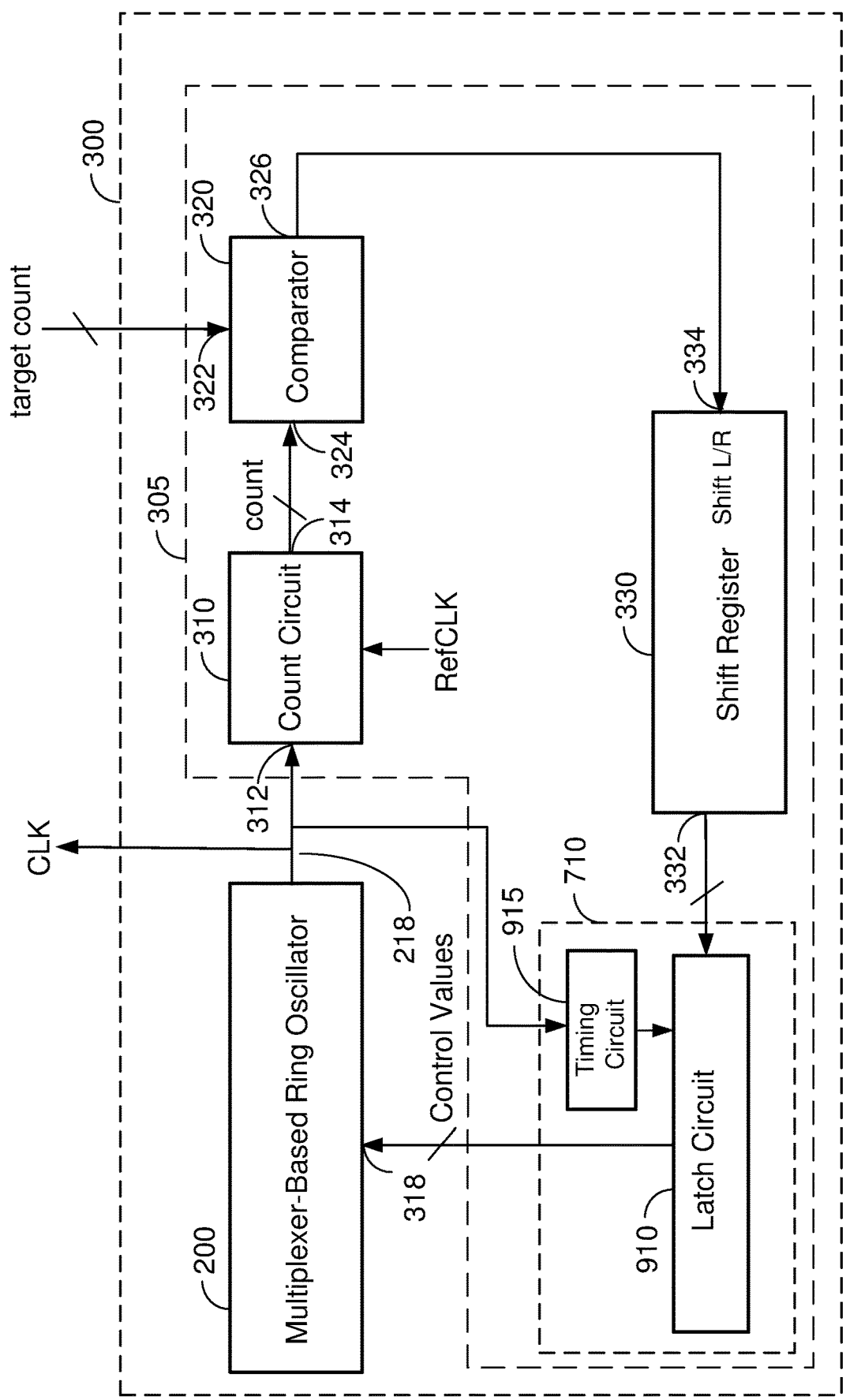
FIG. 9 shows an exemplary implementation of the glitch circuit according to certain aspects of the present disclosure.

FIG. 9 shows an exemplary implementation of the glitch circuit 710 according to certain aspects of the present disclosure. In this example, the glitch circuit 710 includes a latch circuit 910 and a timing circuit 915. The latch circuit 910 is coupled between the output 332 of the shift register 330 and the control inputs of the multiplexers 210-1 to 210-8 (shown in FIGS. 2A to 2C). The latch circuit 910 is configured to receive control values for the multiplexers 210-1 to 210-8 from the shift register 330, latch the control values based on a timing signal from the timing circuit 915, and output the latched control values to the control inputs of the respective multiplexers 210-1 to 210-8. The latch circuit 910 may be implemented with clock-domain-crossing (CDC) flip-flops and/or other types of latches.

The timing circuit 915 times the latching of the control values by the latch circuit 910 to prevent glitches in the ring oscillator 200. In certain aspects, the timing circuit 915 uses the clock signal CLK as a timing reference. In one example, the timing circuit 915 may detect an edge of the clock signal CLK, and output a timing signal to the latch circuit 910 after a time delay $T_D$ from the detected edge of the clock signal CLK. In this example, the timing circuit 915 may generate the timing signal by simply delaying the clock signal CLK by the time delay $T_D$, and outputting the delayed clock signal CLK as the timing signal. For example, the timing circuit 915 may generate the timing signal by delaying the clock signal CLK by approximately a quarter of a period of the clock signal CLK. In this example, the timing circuit 915 may be implemented with a delay line (e.g., one or more delay buffers coupled in series) that delays the clock signal by the time delay $T_D$, and the latch circuit 910 may be configured to latch the control values on a rising edge of the timing signal. As discussed above, the time delay $T_D$ is set such that the timing circuit 915 outputs the timing signal within a glitch-free time window, an example of which is shown in FIG. 8B. In response to the timing signal, the latch circuit 910 latches the control values from the shift register 330, and outputs the latched control values to the control inputs of the respective multiplexers 210-1 to 210-8. Since the control values from the shift register 330 are latched and output to the multiplexers 210-1 to 210-8 within the glitch-free time window by the timing signal, a change in one of the control values is input to the control input of the respective multiplexer (i.e., respective one of the multiplexers 210-1 to 210-8) within the glitch-free time window, thereby avoiding a glitch. In certain aspects, due to the specific nature of the pattern of ones and zeros stored in the shift register 330, glitches are avoided during dynamic tuning of the oscillator 200 as only a single bit in the pattern changes at a time (e.g., per update period). This also provides an opportunity to reduce power by clock gating latches (e.g., flip-flops) in the latch circuit 910 which are not expected to change value in the next cycle.

It is to be appreciated that the clock signal CLK output to the count circuit 310 and the clock signal CLK output to the timing circuit 915 do not need to be tapped at the same location within the ring oscillator 200, and may be tapped at different locations within the ring oscillator 200.

Figure 10:
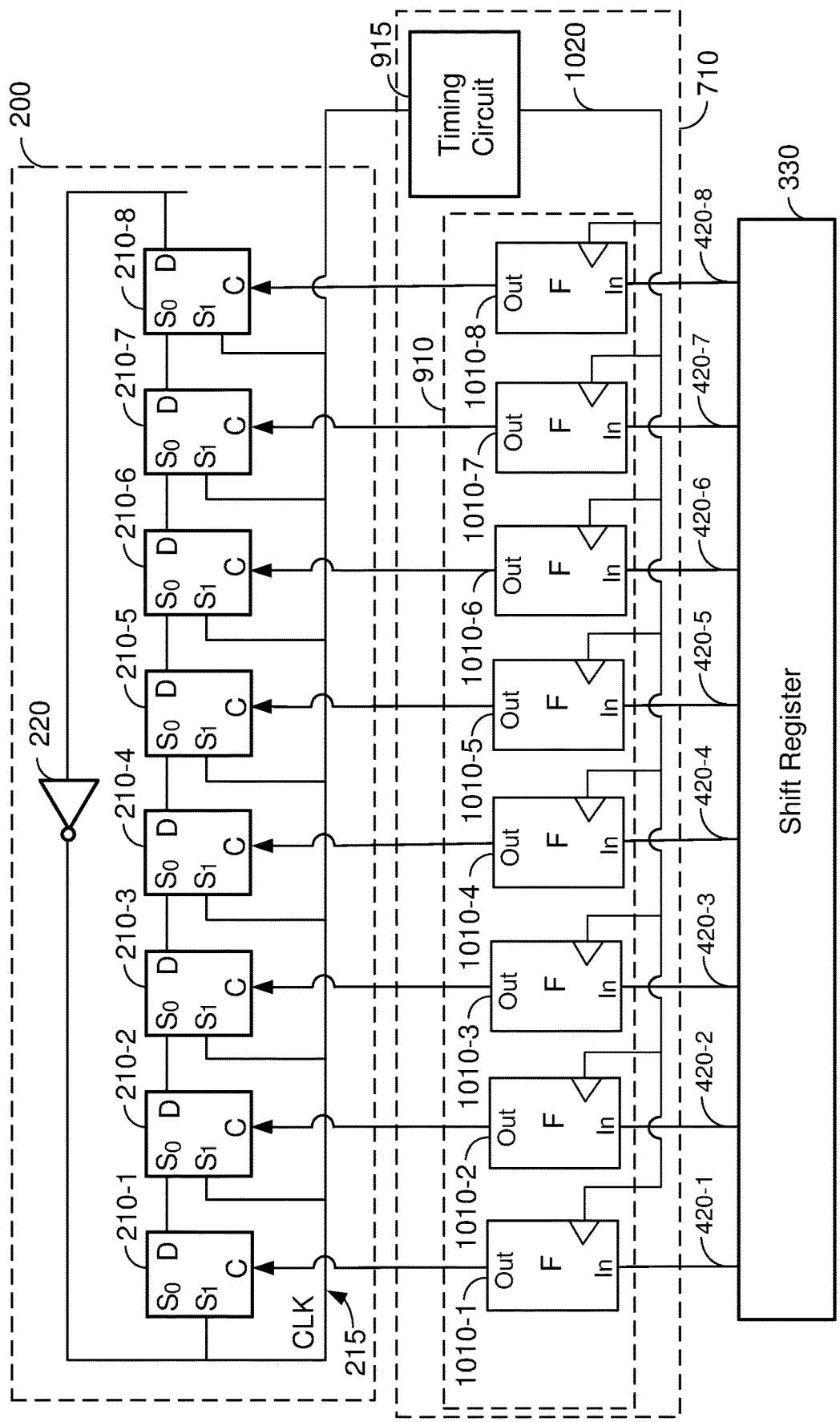
FIG. 10 shows an exemplary implementation of a latch circuit according to certain aspects of the present disclosure.

FIG. 10 shows an exemplary implementation of the latch circuit 910 according to certain aspects of the present disclosure. In this example, the latch circuit 910 includes latches 1010-1 to 1010-8, in which the control line 420-1 to 420-8 for each of the multiplexers 210-1 to 210-8 goes through a respective one of the latches 1010-1 to 1010-8 to prevent glitch, as discussed further below. Each of the latches 1010-1 to 1010-8 may be implemented with a flip-flop or another type of latch. The control lines 420-1 to 420-8 are coupled to the output 332 of the shift register 330 shown in FIG. 9. In this example, the output 332 of the shift register 330 is a parallel output.

Each of the latches 1010-1 to 1010-8 has a latch input (labeled "In"), an output (labeled "Out"), and a clock input (represented by a triangle). The latch input of each of the latches 1010-1 to 1010-8 is coupled to the respective one of the control lines 420-1 to 420-8. In certain aspects, each of the latches 1010-1 to 1010-8 in FIG. 10 may include a combination of two or more flip-flops in series in order to avoid metastability that can arise otherwise when a signal is launched off a slow clock signal (e.g., from the shift register 330 at RefCLK or the reset signal) and captured by a fast clock signal (e.g., the ring oscillator 200 running at the fast clock signal CLK). For the exemplary implementation of the shift register 330 shown in FIG. 4A, the latch input of each of the latches 1010-1 to 1010-8 is coupled to a respective one of the storage elements 410-1 to 410-8 via the respective one of the control lines 420-1 to 420-8 to receive the control value held in the respective one of the storage elements 410-1 to 410-8. The output of each of the latches 1010-1 to 1010-8 is coupled to the control input of the respective one of the multiplexers 210-1 to 210-8. The clock input of each of the latches 1010-1 to 1010-8 may be coupled to the timing circuit 915 via a timing control signal line 1020.

In this example, each of the latches 1010-1 to 1010-8 is configured to receive the timing signal from the timing circuit 915 at the respective clock input, latch (i.e., sample) the respective control value from the shift register 330 at the respective latch input in response to the timing signal, and output the respective latched (i.e., sampled) control value to the control input of the respective one of the multiplexers 210-1 to 210-8. As discussed above, the timing circuit 915 outputs the timing signal within a glitch-free time window to prevent glitches in the ring oscillator 200. In one example, each of the latches 1010-1 to 1010-8 may be configured to latch the respective control value on an edge (e.g., rising edge) of the timing signal. As discussed above, the timing circuit 915 may generate the timing signal by delaying the clock signal CLK (e.g., by approximately a quarter of a period of the clock signal CLK), and outputting the delayed clock signal as the timing signal. In this example, the latches 1010-1 to 1010-8 may be configured to latch the respective control value on a rising edge of the timing signal (i.e., rising edge of the delay clock signal).

In certain aspects, the timing circuit 915 may gate the timing signal to one or more of the latches 1010-1 to 1010-8 based on the current pattern of the control values at the output of the shift register 330 to conserve power. In these aspects, the timing circuit 915 may be coupled to the output 332 of the shift register 330 to sense the current pattern of the control values. Also, the timing circuit 915 may be individually coupled to the clock input of each of the latches 1010-1 to 1010-8 to individually control the timing signal to each of the latches 1010-1 to 1010-8.

In one example, the timing circuit 915 may be configured to sense the current pattern of the control values at the output 332 of the shifter register 330, and gate the timing signal to one or more of the latches 1010-1 to 1010-8 based on the sensed pattern of the control values. For example, if the current pattern of the control values corresponds to the fifth row in FIG. 4B, then the timing circuit 915 may gate the timing signal to latches 1010-1 to 1010-3, 1010-7 and 1010-8 for the next cycle (e.g., update period). This is because the control values to latches 1010-1 to 1010-3, 1010-7 and 1010-8 are not expected to change in the next cycle regardless of whether the shift register 330 shifts to the left or to the right in the next cycle, assuming the shift register 330 shifts by one shift position in the next cycle. In this example, it is not necessary for latches 1010-1 to 1010-3, 1010-7 and 1010-8 to latch in the next cycle since their respective control values are not expected to change in the next cycle. By gating the timing signal to latches corresponding to control values that are not expected to change in the next cycle, the timing circuit 915 reduces the number of the latches 1010-1 to 1010-3, 1010-7 and 1010-8 that latch in the next cycle, which reduces dynamic power consumption in the latch circuit 910. In each cycle, the timing circuit 915 may output the timing signal to the clock input of each of one or more of the latches 1010-1 to 1010-8.

Figure 11:
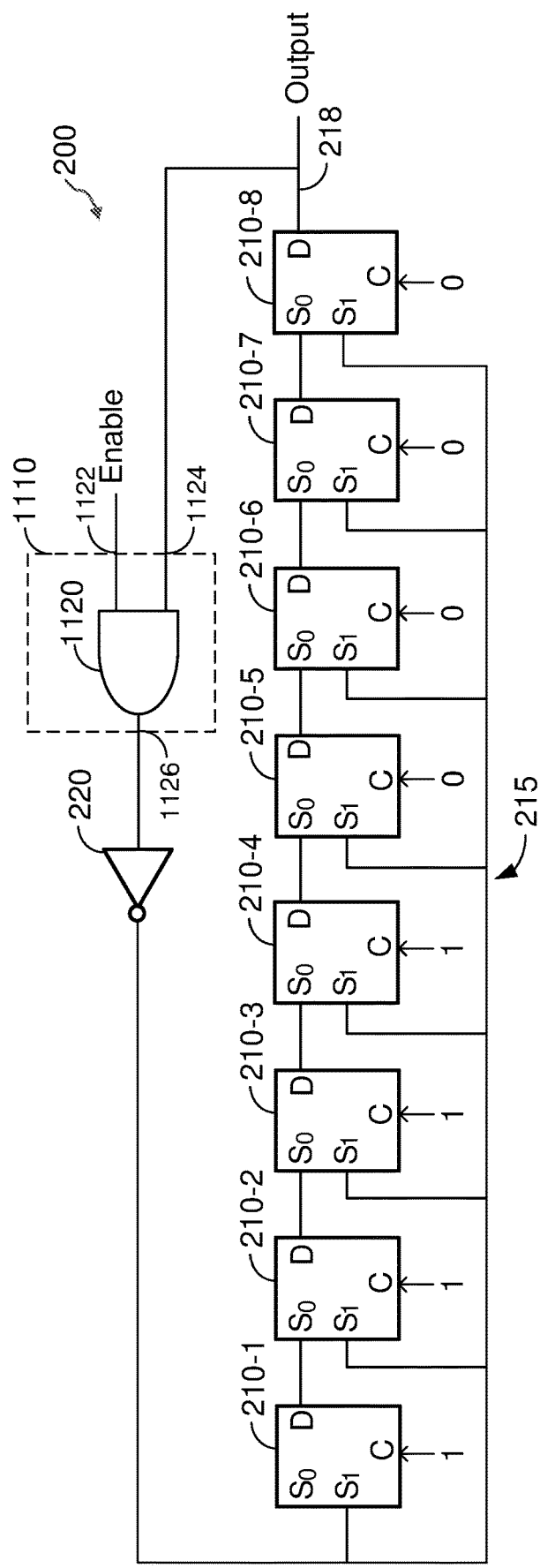
FIG. 11 shows an example of an enable circuit configured to selectively enable or disable the multiplexer-based ring oscillator according to certain aspects of the present disclosure.

In certain aspects, the ring oscillator 200 may be selectively enabled or disabled. For example, the ring oscillator 200 may be enabled to generate the clock signal CLK when the clock signal CLK is needed, and may be disabled when the clock signal CLK is not needed to conserve power. In this regard, FIG. 11 shows an example in which the ring oscillator 200 includes an enable circuit 1110 in the oscillator loop path of the ring oscillator 200. In the example in FIG. 11, the enable circuit 1110 is coupled between the output of the last multiplexer 210-8 in the multiplexer chain and the bypass signal path 215. The enable circuit 1110 receives an enable signal ("Enable"), and enables or disables the ring oscillator 200 based on the bit value of the enable signal.

In the example in FIG. 11, the enable circuit 1110 is implemented with an AND gate 1120 having a first input 1122 configured to receive the enable signal, a second input 1124 coupled to the output of the last multiplexer 210-8 in the multiplexer chain, and an output 1126 coupled to the bypass signal path 215 (e.g., via the inverter 220). Although FIG. 11 shows an example in which the AND gate 1120 is located before the inverter 220 in the oscillator loop path, it is to be appreciated that the AND gate 1120 may be located after the inverter 220 in the oscillator loop path. The AND gate 1120 enables the ring oscillator 200 when the enable signal is high (i.e., logic one), and disables the ring oscillator 200 when the enable signal is low (i.e., logic zero).

It is to be appreciated that the enable circuit 1110 is not limited to the example shown in FIG. 11. For example, the enable circuit 1110 may be implemented with a NAND gate instead of the AND gate 1120. In this example, the NAND gate enables the ring oscillator 200 when the enable signal is high (i.e., logic one), and disables the ring oscillator 200 when the enable signal is low (i.e., logic zero). Also, in this example, the inverter 220 may be omitted since the NAND gate already inverts the signal on the oscillator loop path when the ring oscillator 200 is enabled. It is be appreciated that the enable circuit 1110 may be implemented with other types of logic gates in the oscillator loop path of the ring oscillator 200.

Figure 12:
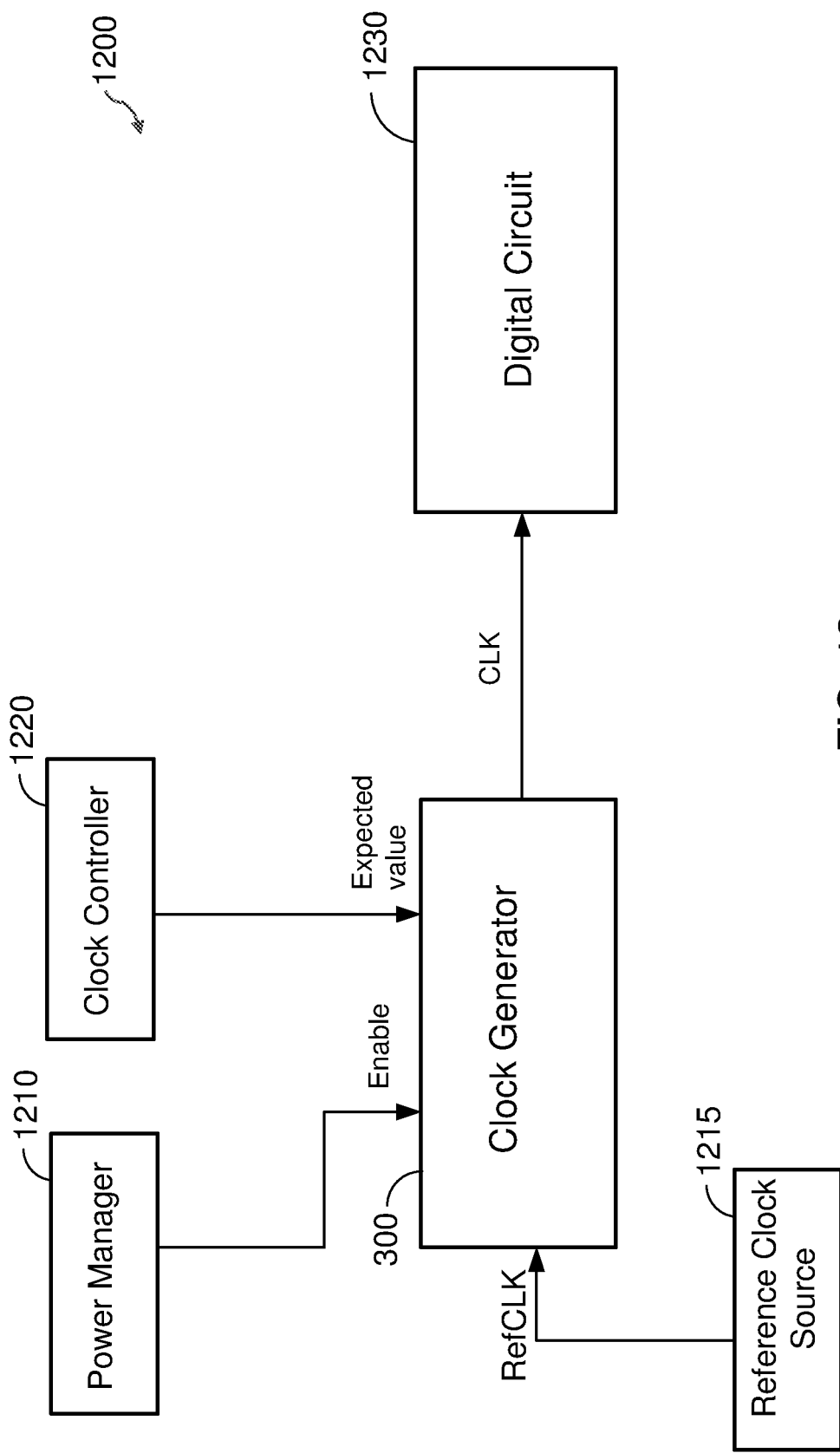
FIG. 12 shows an example of a system including a clock generator according to certain aspects of the present disclosure.

FIG. 12 shows an example of a system 1200 in which the clock generator 300 according to aspects of the present disclosure may be used. In this example, the system 1200 includes the clock generator 300, a power manager 1210, a reference clock source 1215, a clock controller 1220, and a digital circuit 1230. The system 1200 may be part of a wireless handset, a laptop, a wireless access point, or some other device.

The clock generator 300 is coupled to the digital circuit 1230, and outputs the clock signal CLK to the digital circuit 1230 to time operations in the digital circuit 1230. For example, the digital circuit 1230 may include sequential logic (e.g., latches) that is clocked using the clock signal CLK. In another example, the digital circuit 1230 may include a processor, in which the clock signal CLK is input to the processor to time operations of the processor. In this example, the processor may include a general-purpose processor, a digital signal processor (DSP), a baseband modem, an application specific integrated circuit (ASIC), a field programmable gate array (FPGA) or other programmable logic device (PLD), discrete gate logic, discrete hardware components, or any combination thereof.

The reference clock source 1215 is coupled to the clock generator 300. The reference clock source 1215 is configured to generate the reference clock signal RefCLK, and output the reference clock signal RefCLK to the clock generator 300.

The power manager 1210 is coupled to the enable circuit 1110 (shown in FIG. 11) of the ring oscillator 200 in the clock generator 300. The power manager 1210 is configured to control whether the ring oscillator 200 is enabled or disabled using the enable signal. For example, the power manager 1210 may enable or disable the ring oscillator 200 depending on whether the digital circuit 1230 is in an active state or an idle state. When the digital circuit 1230 is in the idle state, the power manager 1210 may disable the ring oscillator 200 to conserve power. In the idle state, the digital circuit 1230 may be powered down, or logic states in the digital circuit 1230 may be static. When the digital circuit 1230 is in the active state, the power manager 1210 enables the ring oscillator 200.

The clock controller 1220 is configured to set the clock frequency of the clock generator 300 by generating the target count value based on a target clock frequency, and outputting the target count value to the comparator 320 (shown in FIG. 3) in the clock generator 300. In certain aspects, the clock controller 1220 may operate the digital circuit 1230 in any one of multiple performance modes, in which each performance mode has a corresponding clock frequency. In these aspects, the clock controller 1220 operates the digital circuit 1230 in one of the performance modes by setting the target count value input to the comparator 320 based on the clock frequency corresponding to the performance mode.

Figure 13:
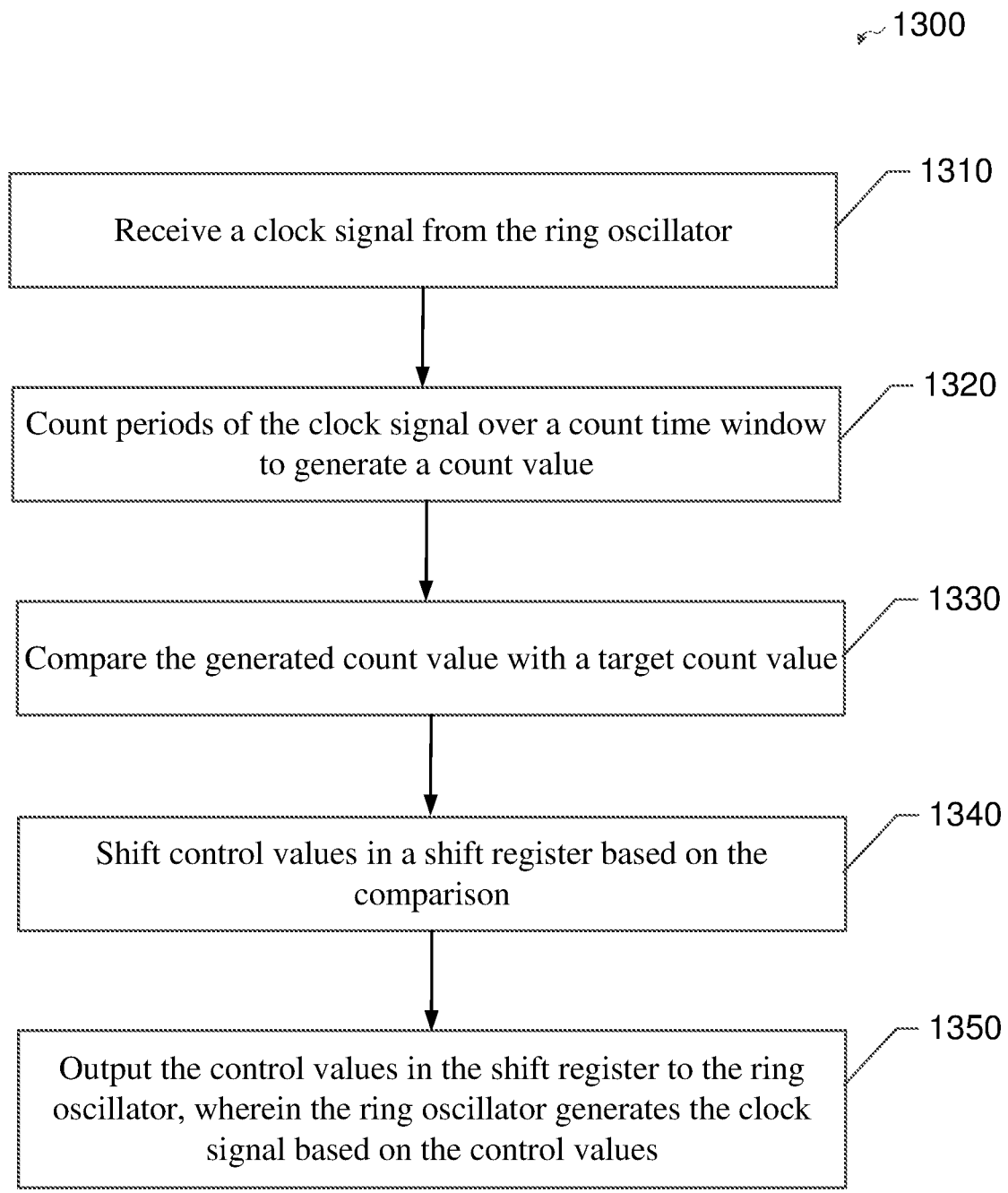
FIG. 13 is a flowchart illustrating a method for controlling a ring oscillator according to certain aspects of the present disclosure.

FIG. 13 is a flowchart illustrating a method 1300 for controlling a ring oscillator according to aspects of the present disclosure. The ring oscillator may be a multiplexer-based ring oscillator (e.g., ring oscillator 200).

At block 1310, a clock signal is received from the ring oscillator.

At block 1320, periods of the clock signal are counted over a count time window to generate a count value. For example, the periods of the clock signal may be counted by a count circuit (e.g., count circuit 310), which may include a counter (e.g., counter 510).

At block 1330, the generated count value is compared with a target count value. For example, the generated count value may be compared with the target count value by a comparator (e.g., comparator 320).

At block 1340, control values in a shift register are shifted based on the comparison. For example, the shift register may correspond to shift register 330. The shift register 330 may shift the control values based on a shift control signal generated by the comparator 320 based on the comparison.

At block 1350, the control values in the shift register are output to the ring oscillator, wherein the ring oscillator generates the clock signal based on the control values. For example, the control values in the shift register may control a frequency of the ring oscillator and the target count value may correspond to a target clock frequency.

In certain aspects, shifting the control values in the shift register at block 1340 may include shifting the control values in the shift register in a first shift direction (e.g., left) if the generated count value is greater than the target count value, and shifting the control values in the shift register in a second shift direction (e.g., right) if the generated count value is less than the target count value, wherein the second shift direction is opposite the first shift direction.

Any reference to an element herein using a designation such as "first," "second," and so forth does not generally limit the quantity or order of those elements. Rather, these designations are used herein as a convenient way of distinguishing between two or more elements or instances of an element. For example, the target count value discussed above may be referred to as a first count value and the count value from the count circuit 310 may be referred to as a second count value to distinguish between the two count values. Thus, a reference to first and second elements does not mean that only two elements can be employed, or that the first element must precede the second element.

The shift control signal discussed above may include one signal or multiple signals sent in parallel. For the example in which the shift control signal includes multiple signals, the first, second and third values of the shift control signal discussed above may each include a respective combination of values (e.g., bit values) of the multiple signals.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A clock generator, comprising:
    a ring oscillator including an input and an output;
    a count circuit including an input and an output, wherein the input of the count circuit is coupled to the output of the ring oscillator;
    a comparator including a first input, a second input, and an output, wherein the first input of the comparator is configured to receive a first count value, and the second input of the comparator is coupled to the output of the count circuit; and
    a shift register including a shift control input and an output, wherein the shift control input is coupled to the output of the comparator, and the output of the shift register is coupled to the input of the ring oscillator;
    wherein the shift register is configured to shift control values in the shift register in a first direction if a first value is input to the shift control input, shift the control values in the shift register in a second direction if a second value is input to the shift control input, wherein the first direction is opposite the second direction, and output the control values at the output of the shift register.

2. A clock generator, comprising:
    a ring oscillator including multiple control inputs and an output;
    a count circuit including an input and an output, wherein the input of the count circuit is coupled to the output of the ring oscillator;
    a comparator including a first input, a second input, and an output, wherein the first input of the comparator is configured to receive a first count value, and the second input of the comparator is coupled to the output of the count circuit; and
a shift register including a shift control input coupled to the output of the comparator, wherein the shift register comprises multiple storage elements, and each of the storage elements is coupled to a respective one of the multiple control inputs of the ring oscillator.

3. The clock generator of claim 2, wherein:
the ring oscillator comprises multiple multiplexers; and
each of the multiplexers includes a respective one of the control inputs, a first input, a second input, and an output, wherein the first input is coupled to the output of another one of the multiplexers, and the second input is coupled to a bypass signal path.

4. The clock generator of claim 2, wherein the multiple storage elements are configured to store control values, and the shift register further comprises a shift controller configured to shift the control values in the multiple storage elements in a first direction or a second detection based on a shift control signal input to the shift control input, wherein the first direction is opposite the second direction.

5. The clock generator of claim 4, wherein the shift controller is configured to shift the control values in the first direction if the shift control signal has a first value, and shift the control values in the second direction if the shift control signal has a second value.

6. The clock generator of claim 2, further comprising a glitch circuit, wherein the glitch circuit comprises:
multiple latches, wherein each of the multiple latches includes a latch input coupled to a respective one of the multiple storage elements, an output coupled to a respective one of the control inputs of the ring oscillator, and a clock input; and
a timing circuit configured to receive a clock signal from the ring oscillator, delay the received clock signal by a time delay to generate a timing signal, and output the timing signal to the clock input of each of one or more of the latches.

7. The clock generator of claim 6, wherein the time delay is approximately equal to a quarter of a period of the clock signal.

8. The clock generator of claim 1, wherein the ring oscillator is configured to output a clock signal at the output of the ring oscillator, and the count circuit is configured to:
count periods of the clock signal over a count window to generate a second count value; and
output the second count value at the output of the count circuit.

9. The clock generator of claim 8, wherein the comparator is configured to:
compare the first count value with the second count value;
generate a shift control signal based on the comparison; and
output the shift control signal at the output of the comparator.

10. The clock generator of claim 8, wherein the ring oscillator is configured to control a frequency of the clock signal based on the control values.

11. The clock generator of claim 9, wherein
the shift control signal has the first value if the second count value is greater than the first count value; and
the shift register is configured to shift the control values in the shift register in a first direction if the shift control signal has the first value.

12. The clock generator of claim 11, wherein
the shift control signal has the second value if the second count value is less than the first count value.

13. A method for controlling a ring oscillator, comprising:
receiving a clock signal from the ring oscillator;
counting periods of the clock signal over a count time window to generate a count value;
comparing the generated count value with a target count value;
shifting control values in a shift register based on the comparison; and
outputting the control values in the shift register to the ring oscillator, wherein the ring oscillator generates the clock signal based on the control values;
wherein shifting the control values in the shift register comprises:
shifting the control values in the shift register in a first shift direction if the generated count value is greater than the target count value; and
shifting the control values in the shift register in a second shift direction if the generated count value is less than the target count value, wherein the second shift direction is opposite the first shift direction.

14. The method of claim 13, wherein outputting the control values in the shift register to the ring oscillator comprises outputting the control values in the shift register to the ring oscillator in parallel.

15. The method of claim 13, wherein outputting the control values in the shift register to the ring oscillator comprises:
receiving the control values in the shift register; and
outputting the received control values to the ring oscillator within a glitch-free time window.

16. The method of claim 13, wherein outputting the control values in the shift register to the ring oscillator comprises:
latching the control values in the shift register within a glitch-free time window; and
outputting the latched control values to the ring oscillator.

17. The method of claim 13, wherein the ring oscillator comprises a chain of multiplexers, and outputting the control values in the shift register to the ring oscillator comprises:
outputting each of the control values to a respective one of the multiplexers, wherein the control values control a frequency of the clock signal by controlling a number of the multiplexers through which an oscillator signal of the ring oscillator propagates.

18. The method of claim 17, wherein the target count value corresponds to a target frequency.

19. An apparatus for controlling a ring oscillator, comprising:
means for receiving a clock signal from the ring oscillator;
means for counting periods of the clock signal over a count time window to generate a count value;
means for comparing the generated count value with a target count value;
means for shifting control values in a shift register based on the comparison; and
means for outputting the control values in the shift register to the ring oscillator, wherein the ring oscillator generates the clock signal based on the control values;
wherein the means for shifting the control values in the shift register comprises:
means for shifting the control values in the shift register in a first shift direction if the generated count value is greater than the target count value; and means for shifting the control values in the shift register in a second shift direction if the generated count value is less than the target count value, wherein the second shift direction is opposite the first shift direction.

* * * * *